(12) United States Patent
Kim et al.

(10) Patent No.: US 12,556,191 B2
(45) Date of Patent: Feb. 17, 2026

(54) ANALOG-TO-DIGITAL CONVERSION

(71) Applicant: SAMSUNG ELECTRONICS CO., LTD., Suwon-si (KR)

(72) Inventors: Jaeha Kim, Seoul (KR); Young Choi, Suwon-si (KR); Myoungbo Kwak, Suwon-si (KR); Jaewoo Park, Suwon-si (KR); Youngdon Choi, Suwon-si (KR); Junghwan Choi, Suwon-si (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 108 days.

(21) Appl. No.: 18/658,820

(22) Filed: May 8, 2024

(65) Prior Publication Data

US 2025/0038754 A1  Jan. 30, 2025

(30) Foreign Application Priority Data

Jul. 26, 2023  (KR) ........................ 10-2023-0097451

(51) Int. Cl.
*H03M 1/06*    (2006.01)
*H03M 1/12*    (2006.01)
*H03M 1/46*    (2006.01)

(52) U.S. Cl.
CPC ....... *H03M 1/0604* (2013.01); *H03M 1/0624* (2013.01); *H03M 1/1245* (2013.01); *H03M 1/466* (2013.01); *H03M 1/468* (2013.01)

(58) Field of Classification Search
CPC .. H03M 1/0604; H03M 1/468; H03M 1/1245; H03M 1/466; H03M 1/0624
See application file for complete search history.

(56) References Cited

U.S. PATENT DOCUMENTS 7,605,741 B2  10/2009  Hurrell
8,736,480 B1   5/2014  Cowley et al.
8,737,490 B1   5/2014  Wilson et al.
(Continued)

OTHER PUBLICATIONS

Tabasy et al., "A 6 bit 10 GS/s TI-SAR ADC With Low-Overhead Embedded FFE/DFE Equalization for Wireline Receiver Applications," IEEE Journal of Solid-State Circuits, Nov. 2014, 49(11):1-15.

*Primary Examiner* — Khai M Nguyen
(74) *Attorney, Agent, or Firm* — Fish & Richardson P.C.

(57) ABSTRACT

The present disclosure relates to successive approximation register analog-to-digital converters. An example successive approximation register analog-to-digital converter includes a first sampling and holding circuit that samples an analog signal at a first point in time and generates a first input voltage, a second sampling and holding circuit that samples the analog signal at a second point in time and generates a second input voltage, and a first analog-to-digital converter. The first analog-to-digital converter performs a feed forward equalization function by receiving the first input voltage and the second input voltage, sampling the first input voltage and the second input voltage, and outputting a multi-bit digital signal based on a sampling result of the first input voltage and a sampling result of the second input voltage.

20 Claims, 17 Drawing Sheets

(56) References Cited

U.S. PATENT DOCUMENTS

| | | | |
|---|---|---|---|
| 8,952,839 B2* | 2/2015 | Wang | H03M 1/38 |
| | | | 341/161 |
| 9,602,116 B1 | 3/2017 | Le et al. | |
| 11,095,487 B1 | 8/2021 | Yonar et al. | |
| 11,115,040 B1 | 9/2021 | Xu | |
| 12,160,248 B2* | 12/2024 | Parupalli | H03M 1/804 |
| 2021/0336627 A1 | 10/2021 | Hossain et al. | |

* cited by examiner

ANALOG-TO-DIGITAL CONVERSION

CROSS-REFERENCE TO RELATED APPLICATION

This application claims priority under 35 U.S.C. § 119 to Korean Patent Application No. 10-2023-0097451 filed on Jul. 26, 2023, in the Korean Intellectual Property Office, the disclosures of which are incorporated by reference herein in their entireties.

BACKGROUND

Nowadays, various types of electronic devices are being used. An electronic device may perform various functions. To perform a unique operation, the electronic device may operate individually or may operate while communicating with any other electronic device. As the amount of data exchanged between electronic devices increases, a communication circuit capable of transmitting and receiving signals at high speed is adopted. The electronic devices are connected through a communication channel, and the communication channel transfers transmission and reception signals between the electronic devices.

However, due to various factors such as a skin effect and dielectric loss, a high frequency component of a signal transferred through the communication channel may weaken, thereby causing the reduction of quality of the signal transferred at high speed.

To solve the quality reduction issue, equalizers such as a continuous time linear equalizer (CTLE), a decision feedback equalizer (DFE), and a feed forward equalizer may be adopted. In particular, in general, because the feed forward equalizer processes a lot of bits of inputs, the area of the chip and power consumption increases.

SUMMARY

The present disclosure relates to analog-to-digital converters, including a successive approximation register analog-to-digital converter performing a function of a feed forward equalizer without a separate feed forward equalizer.

In general, according to some aspects, a successive approximation register analog-to-digital converter that performs a successive approximation operation includes a first sampling and holding circuit that samples an analog signal at a first point in time and generates a first input voltage, a second sampling and holding circuit that samples the analog signal at a second point in time and generates a second input voltage, and a first analog-to-digital converter that includes a first plurality of capacitors for sampling the first input voltage and a second plurality of capacitors for sampling the second input voltage. The first analog-to-digital converter samples the first input voltage by using at least some capacitors among the first plurality of capacitors and samples the second input voltage by using at least some capacitors among the second plurality of capacitors, and the first analog-to-digital converter outputs a multi-bit digital signal based on a sum of first charges corresponding to a result of sampling the first input voltage and second charges corresponding to a result of sampling the second input voltage.

In general, according to some aspects, a successive approximation register analog-to-digital converter includes a first sampling and holding circuit that generates a first input voltage by sampling an analog signal, a second sampling and holding circuit that generates a second input voltage by sampling the analog signal after the first input voltage is sampled, a first analog-to-digital converter that includes a first tap and a second tap each including a plurality of switched capacitors, and a second analog-to-digital converter that includes a third tap and a fourth tap each including a plurality of switched capacitors. The first tap samples the first input voltage at a first point in time, the second tap samples the second input voltage at a second point in time, the third tap samples the second input voltage at the second point in time, and the first analog-to-digital converter outputs a first multi-bit digital signal based on a sum of first charges corresponding to a sampling result of the first tap and second charges corresponding to a sampling result of the second tap.

In general, according to some aspects, an operating method of a successive approximation register analog-to-digital converter includes generating a first input voltage by sampling an analog signal at a first point in time by using a first sampling and holding circuit, generating a second input voltage by sampling the analog signal at a second point in time by using a second sampling and holding circuit, sampling the first input voltage by using a first tap of a first analog-to-digital converter, sampling the second input voltage by using a second tap of the first analog-to-digital converter, sampling the second input voltage by using a third tap of a second analog-to-digital converter, and outputting a first multi-bit digital signal based on a sampling result of the first tap and a sampling result of the second tap.

BRIEF DESCRIPTION OF THE DRAWINGS

The above and other objects and features of the present disclosure will become apparent by describing in detail implementations thereof with reference to the accompanying drawings.

DETAILED DESCRIPTION

Below, implementations of the present disclosure will be described in detail and clearly to such an extent that an ordinary one in the art easily carries out the present disclosure.

In the detailed description, components described with reference to the terms "part", "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
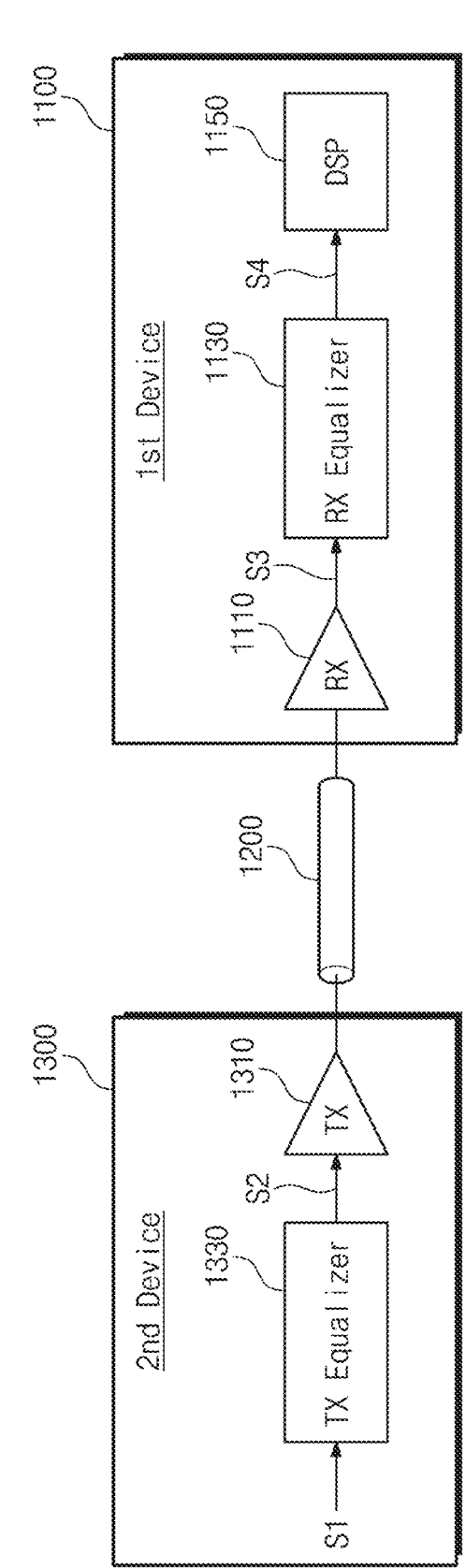
FIG. 1 illustrates a configuration of an example of an electronic system including an equalizer.

FIG. 1 is a block diagram illustrating a configuration of an example of an electronic system 1000 including an equalizer.

The electronic system 1000 includes a first device 1100 and a second device 1300. In some implementations, each of the devices 1100 and 1300 is implemented with one of various electronic devices such as a smartphone, a wearable device, a memory device, a desktop computer, a laptop computer, a video game console, home appliances, and a medical device.

However, the present disclosure is not limited thereto. In some implementations, the electronic system 1000 may be implemented with a single device. In the above implementations, each of the devices 1100 and 1300 may be a component included in a single device and may be implemented with an entity of a circuit, module, chip, and/or package level. The terms "system and "device" are provided for better understanding and are not intended to limit the present disclosure.

The devices 1100 and 1300 may communicate with each other and may exchange data/signals through a communication channel 1200. The communication channel 1200 may include a conductive material for the purpose of transferring data/signals. For example, the communication channel 1200 may be implemented with a trace pattern on a printed circuit board (PCB), a conductive line of a cable, a metal pin/pad of a connector, etc.

The first device 1100 may include a receiver 1110, an equalizer 1130, and a digital signal processor (DSP) 1150. Although not described in drawing, the first device 1100 may include a functional circuit. The functional circuit may operate to provide unique functions of the first device 1100. For example, the functional circuit may include various components such as a processor, such as a central processing unit (CPU) or an application processor (AP), a memory, an image sensor, and a display. The second device 1300 may include a transmitter 1310 and an equalizer 1330.

The devices 1100 and 1300 may be implemented with independent (or separate) components or devices. Accordingly, the first device 1100 may be an external device when viewed from the second device 1300, and the second device 1300 may be an external device when viewed from the first device 1100.

The receiver 1110 may receive a signal through the communication channel 1200 and may provide the received signal to the equalizer 1130. The receiver 1110 may include an electro-static discharge circuit for protecting the first device 1100 from a sudden voltage change (e.g., static electricity).

The equalizer 1130 may generate a signal S4 by performing equalization with respect to the signal received from the receiver 1110. The equalizer 1130 may provide the signal S4 to the DSP 1150. The equalizer 1130 may be also referred to as an "RX equalizer".

The equalizer 1330 may receive a signal S1 and may perform equalization. For example, the signal S1 may be a signal received from the outside of the second device 1300, may be a signal stored in the second device 1300, or may be a signal processed by the second device 1300. The equalizer 1330 may provide the equalized signal to the transmitter 1310. The equalizer 1330 may be also referred to as a "TX equalizer". The transmitter 1310 may provide a signal to the first device 1100 through the communication channel 1200.

In the manner described above, each of the devices 1100 and 1300 may transmit/receive a signal through the communication channel 1200. When a communication speed between the devices 1100 and 1300 increases (e.g., when the communication is performed at a higher frequency or with a greater bandwidth), the devices 1100 and 1300 may exchange a large amount of data during a unit time.

However, due to various factors such as a skin effect and dielectric loss, the communication channel 1200 may show a low-pass frequency response characteristic. Accordingly, in a high-speed operation, the bandwidth of the communication channel 1200 may be limited and thus may be smaller than the bandwidth of signals. In this case, a high-frequency component of a signal transferred through the communication channel 1200 may weaken, thereby causing an inter-symbol interference on a time domain. As a result, as the speed for transferring signals becomes higher, the distortion of the signals may become more serious, and the quality of the signals may become worse. Herein, a symbol may refer to data of one or more bits each having a specific logical value.

To compensate for unintended distortion of signals, the equalizers 1130 and 1330 may perform equalization with respect to the signals. In particular, a configuration and an operation of the equalizer 1130 of the present disclosure, which processes a signal received from the receiver 1110, will be described in detail with reference to the following drawings.

Figure 2:
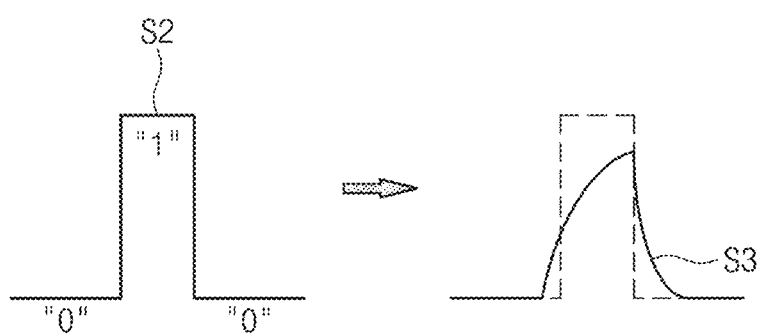
FIGS. 2 and 3 are example conceptual diagrams illustrating distortion of signals transferred through a communication channel of FIG. 1.
Figure 3:
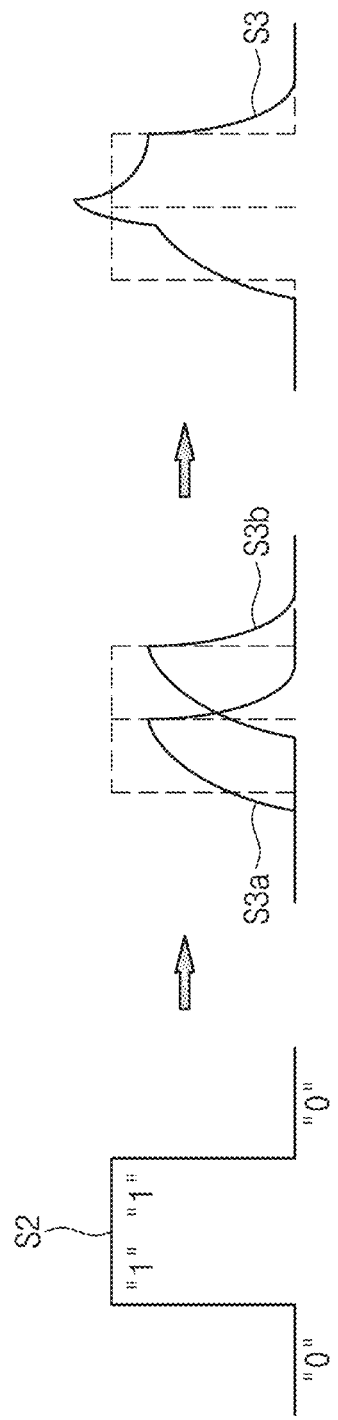

FIGS. 2 and 3 are example conceptual diagrams illustrating distortion of signals transferred through the communication channel 1200 of FIG. 1. It may be understood that signals transferred through the communication channel 1200 are distorted to be similar to the process to be described below.

For better understanding, in the following descriptions, it is assumed that the electronic system 1000 processes signals of a four-level pulse amplitude modulation (PAM-4) manner. However, it may be understood that implementations may be changed or modified to process signals of any other manner (e.g., PAM-8, PAM-16, or NRZ (Non-return-to-zero)).

A signal S2 has a waveform illustrated in FIG. 2. Herein, a horizontal direction of the waveform is associated with a time, and a vertical direction of the waveform is associated with a signal level (e.g., a voltage level).

The waveform of the signal S2 shows that the signal S2 is generated to sequentially have signal levels corresponding to logic "0", logic "1", and logic "0". While the signal S2 is transmitted from the transmitter 1310 to the first device 1100 through the communication channel 1200, the signal S2 is distorted due to the characteristic of the communication channel 1200. For example, a waveform of the signal S3 that is output from the receiver 1110 after the signal S2 is input to the first device 1100 is different from the waveform of the signal S2.

The signal S2 has a waveform illustrated in FIG. 3. The waveform of the signal S2 shows that the signal S2 is generated to sequentially have signal levels corresponding to logic "0", logic "1", logic "1", and logic "0". While the signal S2 is transmitted from the transmitter 1310 to the first device 1100 through the communication channel 1200, symbols each corresponding to logic "1" are distorted due to the characteristic of the communication channel 1200 and respectively correspond to signals S3a and S3b.

The signals S3a and S3b may affect each other on the time domain (i.e., may experience an inter-symbol interference); in this case, the signal S3 may be distorted. For example, the waveform of the signal S3 that is output from the receiver 1110 after the signal S2 is input to the first device 1300 may be different from the waveform of the signal S2.

As described above, while signals are transmitted/received through the communication channel 1200, waveforms of the signals may be distorted unintendedly. For this reason, incorrect data may be exchanged between the devices 1100 and 1300, and an unintended error may occur in operations of the devices 1100 and 1300. This may mean that the electronic system 1000 becomes unstable. The equalizers 1130 and 1330 may be adopted to compensate for the distortion of signals.

Figure 4:
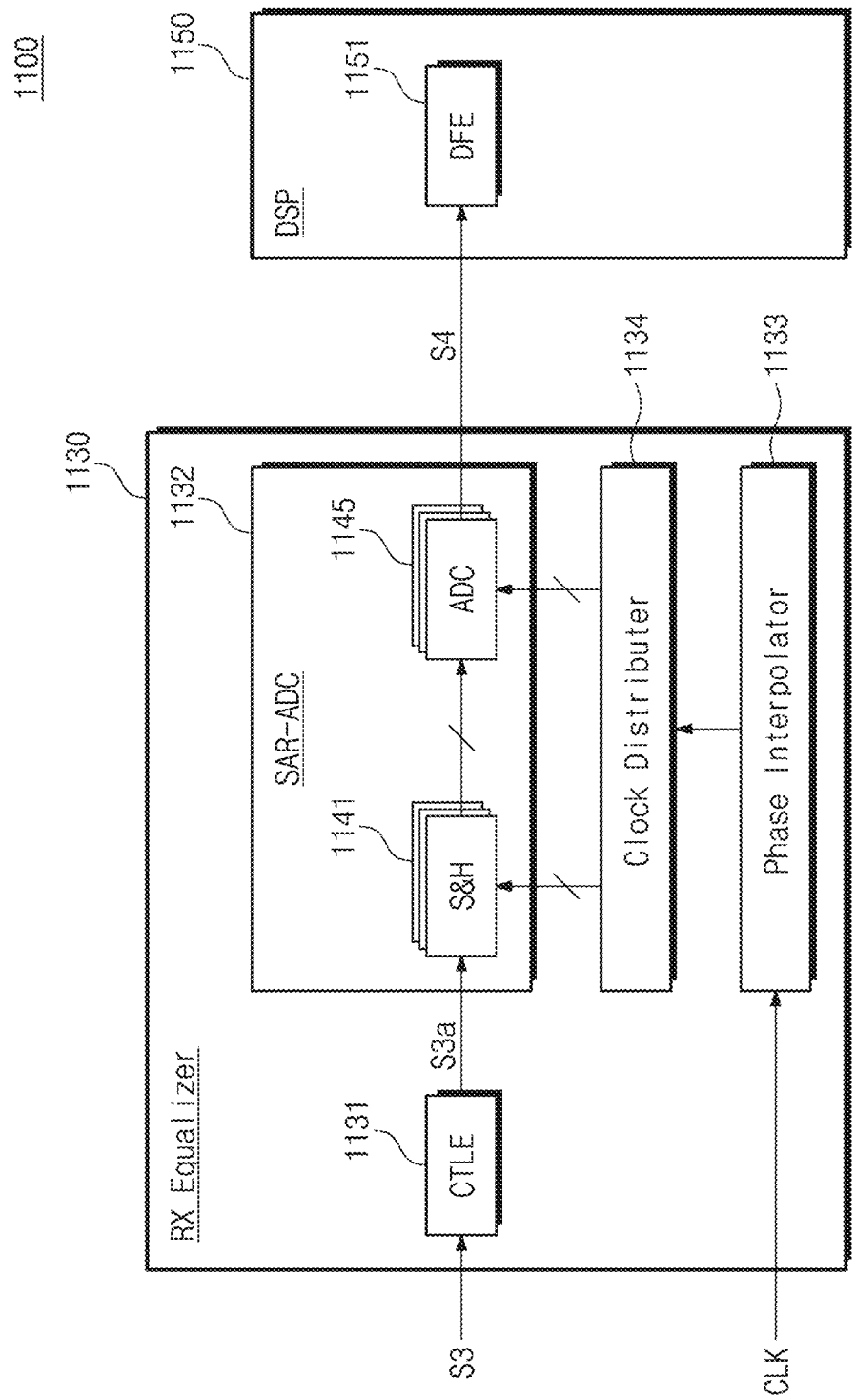
FIG. 4 is an example block diagram illustrating a configuration of a first device of FIG. 1.

FIG. 4 is an example block diagram illustrating a configuration of the first device 1100 of FIG. 1.

The first device 1100 includes the equalizer 1130 and the DSP 1150. The equalizer 1130 includes a continuous time linear equalizer (CTLE) 1131, a successive approximation register analog-to-digital converter (SAR-ADC) 1132, a phase interpolator 1133, and a clock distributer 1134. The DSP 1150 includes a decision feedback equalizer (DFE) 1151.

The CTLE 1131 may receive an input signal through the communication channel 1200 and may remove an unnecessary frequency component of the input signal. The CTLE 1131 may operate as a high pass filter for the purpose of compensating for a low-pass frequency response characteristic. That is, the CTLE 1131 may reduce low-frequency distortion caused in the communication channel 1200.

In some implementations, the CTLE 1131 may be implemented with a passive CTLE or an active CTLE. For example, when the CTLE 1131 is implemented with a passive CTLE, the CTLE 1131 may include passive elements such as at least one resistor and at least one capacitor. For example, when the CTLE 1131 is implemented with an active CTLE, the CTLE 1131 may include an active element, such as a transistor, in addition to the resistor. However, the present disclosure is not limited thereto. For example, the CTLE 1131 may be implemented with various elements for compensating for the low-pass frequency response characteristic of the communication channel 1200.

The SAR-ADC 1132 may be configured to generate the digital signal S4 by quantizing the signal S3 in a binary search manner. The SAR-ADC 1132 may include a plurality of sampling and holding circuits 1141 and a plurality of ADCs 1145 for the purpose of efficiently processing a signal received at high speed.

The sampling and holding circuits 1141 may sample and hold the signal S3a at a given timing for the purpose of performing time interleaving. For example, the sampling and holding circuits 1141 may sample and hold the signal S3a at different points in time. After sampling and holding the signal S3a, each sampling and holding circuit may provide a sampling value to the corresponding ADC. The ADCs 1145 may receive the sampling values from the sampling and holding circuits 1141 and may generate the signal S4 by quantizing the sampling values based on the binary search manner.

In some implementations, the first device 1100 of the present disclosure may not include a separate feed forward equalizer (FFE) that is disposed outside an SAR-ADC (or inside a DSP) in general. In contrast, each of the ADCs 1145 may be configured to perform the function of the FFE. To this end, each of the ADCs 1145 may include a plurality of taps each including a plurality of capacitors, and the plurality of taps may sample input voltages (i.e., outputs of the sampling and holding circuits 1141) at different points in time. In this case, at least some of the capacitors of each tap may be implemented to participate in sampling, and a weight that is applied to the sampling performed by each tap may be differently set for each tap. Each of the ADCs 1145 may sum sampling results to which weights are applied, and a summed sampling result may have a resolution higher than a resolution (i.e., an FFE coefficient) of the sampling performed by one tap. Each of the ADCs 1145 may output a digital signal (i.e., S4) based on a summing result.

According to the above configuration and operation, in analog-to-digital conversion, as the mutual influence of signals received at different points in time is considered, the same effect as the FFE is performed in the SAR-ADC 1132 may be implemented. That is, even though the FFE is not separately provided outside the SAR-ADC 1132, because the same effect as the FFE is provided in the SAR-ADC 1132 is implemented, a circuit size may decrease, and power consumption may also be reduced. The SAR-ADC 1132 of the present disclosure will be described in detail with reference to the following drawings.

The phase interpolator 1133 may generate clocks of different phases based on a clock CLK. The clock distributer 1134 may receive the clocks of different phases from the phase interpolator 1133 and may distribute clocks necessary for the operations of the sampling and holding circuits 1141 and the ADCs 1145. Meanwhile, although not illustrated in drawing, to obtain a clock having an appropriate frequency necessary for the operation of the phase interpolator 1133, the equalizer 1130 may further include a divider that divides the clock CLK.

A DFE 1151 may apply a weight to each of a previous symbol, a current symbol, and a next symbol for the purpose of removing the inter-symbol interference from the signal S4.

Meanwhile, the implementation illustrated in FIG. 4 is provided as an example. In some implementations, the equalizer 1130 may not include the CTLE 1131 and/or the DFE 1151. Although not illustrated in drawing, the DSP 1150 may further include a clock and data recovery (CDR) circuit recovering a clock and data from the signal S4 output from the equalizer 1130.

Figure 5:
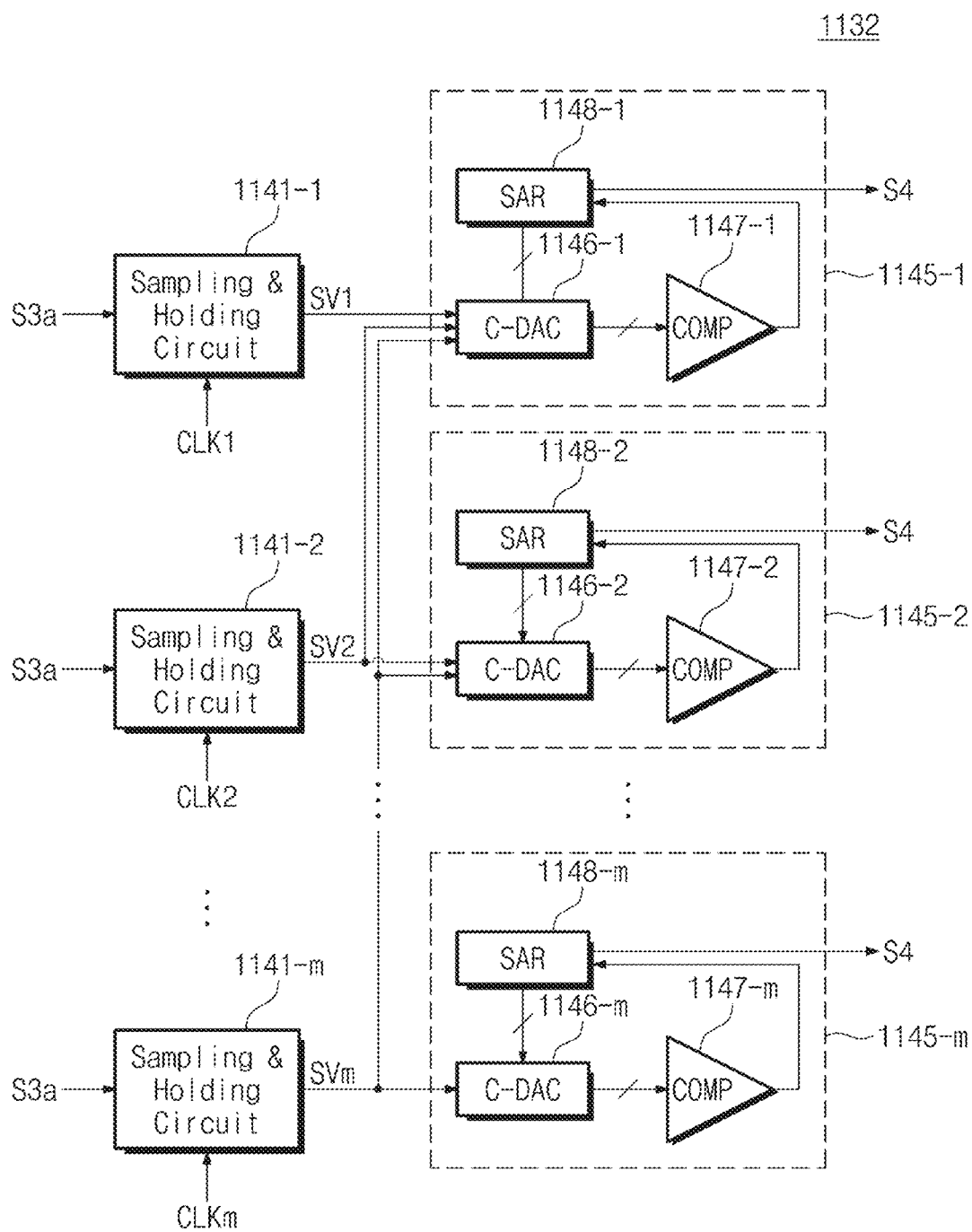
FIG. 5 is an example block diagram illustrating a configuration of an SAR-ADC of FIG. 4.

FIG. 5 is an example block diagram illustrating a configuration of the SAR-ADC 1132 of FIG. 4.

The SAR-ADC 1132 includes sampling and holding circuits 1141-1 to 1141-m and ADCs 1145-1 to 1145-m. Each of the ADCs 1145-1 to 1145-m includes a capacitive digital-to-analog converter (C-DAC), a successive approximation register (SAR) logic circuit, and a comparator (COMP). In some implementations, the first ADC 1145-1 includes a first C-DAC 1146-1, a first comparator 1147-1, and a first SAR logic circuit 1148-1. The remaining ADCs 1145-2 to 1145-*m* have a configuration similar to that of the first ADC 1145-1.

Referring to FIG. 5, the sampling and holding circuits 1141-1 to 1141-*m* may sample the signal S3*a* based on clocks CLK1 to CLKm which have different phases. As a result, the sampling and holding circuits 1141-1 to 1141-*m* may sequentially latch the signal S3*a* at enable timings of the clocks CLK1 to CLKm and may sequentially generate sampling values SV1 to SVm. The sampling and holding circuits 1141-1 to 1141-*m* may hold the sampling values SV1 to SVm. The sampling and holding circuits 1141-1 to 1141-*m* may sequentially output the sampling values SV1 to SVm, and the sampling values SV1 to SVm may be respectively input to the ADCs 1145-1 to 1145-*m* as an input voltage.

Each of the ADCs 1145-1 to 1145-*m* may convert an analog signal into a digital signal based on a sampling value (i.e., one of the sampling values SV1 to SVm). Alternatively, based on a plurality of sampling values (i.e., at least two of the sampling values SV1 to SVm), each of the ADCs 1145-1 to 1145-*m* may perform analog-to-digital conversion and may simultaneously perform the function of the feed forward equalizer (FFE).

In some implementations, the first C-DAC 1146-1 may include a plurality of taps each including a plurality of capacitors. The taps of the first C-DAC 1146-1 may respectively sample input voltages sampled by sampling and holding circuits at different points in time. For example, the first tap of the first ADC 1145-1 may perform sampling based on an input voltage received from the first sampling and holding circuit 1141-1. The second tap of the first ADC 1145-1 may perform sampling based on an input voltage received from the second sampling and holding circuit 1141-2.

In some implementations, the sampling of the input voltage may be performed by at least some of the capacitors of the first C-DAC 1146-1. To this end, the first SAR logic circuit 1148-1 may individually control switches connected to the capacitors of the first C-DAC 1146-1. In some implementations, the first SAR logic circuit 1148-1 may generate a control signal, which allows at least some of the capacitors of the first C-DAC 1146-1 to participate in sampling, by using a digital value (i.e., an output of the first SAR logic circuit 1148-1) in a successive approximation operation that is performed previously. As a result, some capacitors of the first C-DAC 1146-1 may participate in sampling.

In some implementations, a sum of capacitances of capacitors participating in sampling from among the capacitors of the first tap of the first C-DAC 1146-1 may be different from a sum of capacitances of capacitors participating in sampling from among the capacitors of the second tap of the first C-DAC 1146-1. For example, that sums are different may be regarded semantically as different weights (i.e., FFE coefficients) are applied to sampling operations of different taps. However, the present disclosure is not limited thereto. In some implementations, sums of capacitances may be equal to each other.

The first SAR logic circuit 1148-1 may control the taps of the first C-DAC 1146-1 such that the charge sharing is occurred. The total amount of shared charges may correspond to a sum of values obtained by multiplying voltages input at different points in time and weights together. That is, the total amount of shared charges may correspond to a result value obtained through the execution of an FFE filter, and a coefficient of the FFE filter may indicate a sum of capacitances of capacitors participating in sampling from among capacitors of each C-DAC. In other words, an operation of performing charge sharing after taps sample input voltages sampled by sampling and holding circuits at different points in time may be substantially the same as an operation of performing feed forward equalization.

The first comparator 1147-1 may compare a voltage corresponding to the amount of charges accumulated at each tap with a reference voltage and may sequentially output digital values respectively corresponding to the taps as a comparison result. The voltage corresponding to the amount of charges accumulated at all the taps may be input to a first terminal of the first comparator 1147-1, and the reference voltage may be input to a second terminal of the first comparator 1147-1. The reference voltage input to the first comparator 1147-1 may be a ground voltage (refer to FIG. 6), but the present disclosure is not limited thereto.

The first SAR logic circuit 1148-1 may generate the multi-bit digital signal S4 by performing the successive approximation operation based on the digital values received from the first comparator 1147-1. The value of the digital signal S4 may be stored in a register included inside (or outside) the first SAR logic circuit 1148-1. The first SAR logic circuit 1148-1 may output the digital signal S4 to the outside (e.g., the DSP 1150 of FIG. 4) and may control the first C-DAC 1146-1 based on the digital signal S4 such that at least some of capacitors of a tap of the first C-DAC 1146-1 participate in sampling.

As described above, as analog-to-digital conversion is performed by using the above manner in which different weights are applied to input voltages provided at different points in time, the FFE function of removing the distortion due to the inter-symbol interference may be performed by the first ADC 1145-1. In addition, to remove the distortion due to the inter-symbol interference more efficiently, the first ADC 1145-1 may further use the third sampling value SV3. In some implementations, the first ADC 1145-1 may further use the fourth sampling value SV4.

Figure 6:
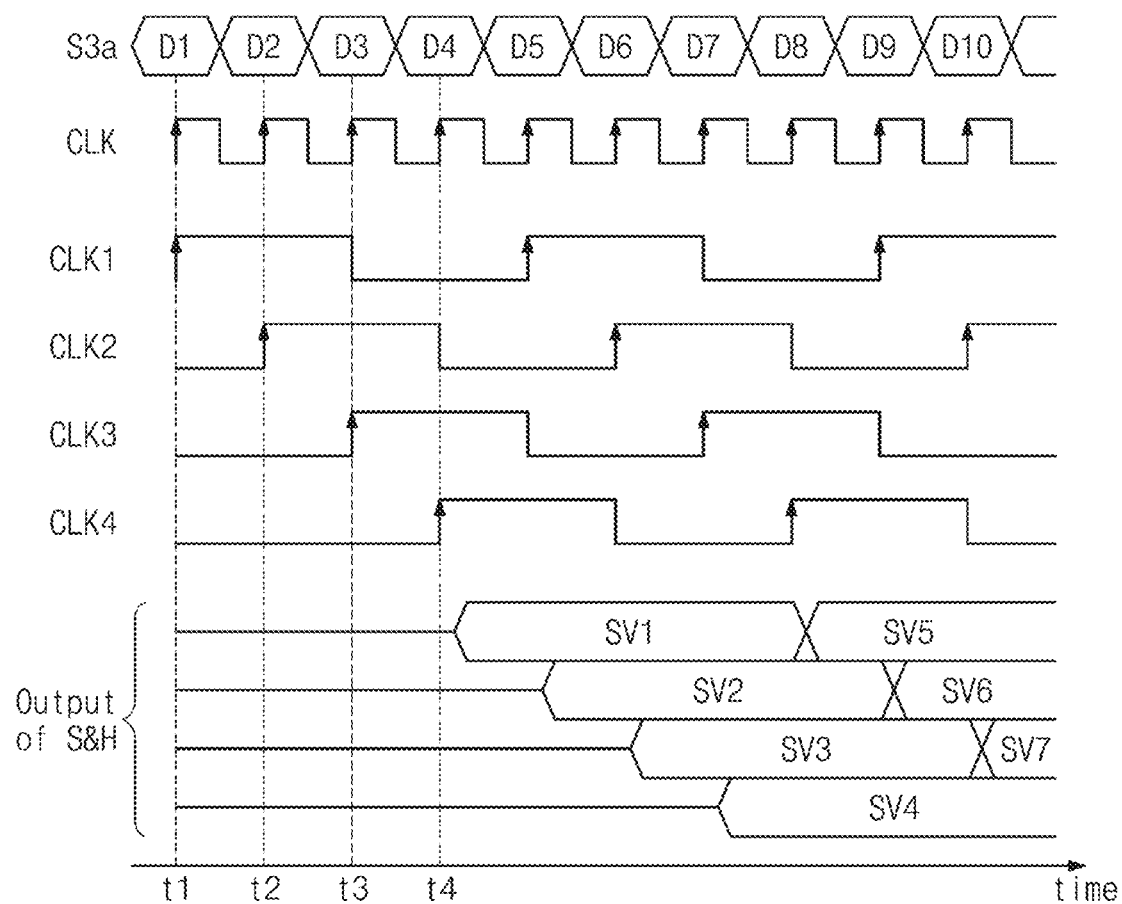
FIG. 6 is an example timing diagram illustrating an operation in sampling and holding circuits of FIG. 5.

FIG. 6 is an example timing diagram illustrating an operation in the sampling and holding circuits 1141 of FIG. 5.

For better understanding, it is assumed that "m" is 10, and it is assumed that a frequency of a clock (e.g., CLK1) output from the clock distributer 1134 is half the frequency of the clock CLK, as illustrated in FIG. 6. In this case, the clock CLK1 may be input to the sampling and holding circuits 1141-1, 1141-5, and 1141-9, the clock CLK2 may be input to the sampling and holding circuits 1141-2, 1141-6, and 1141-10, the clock CLK3 may be input to the sampling and holding circuits 1141-3 and 1141-7, and the clock CLK4 may be input to the sampling and holding circuits 1141-4 and 1141-8.

At the first point in time t1, the first sampling and holding circuit 1141-1 may sample the signal S3*a* to generate the first sampling value SV1. As in the above description, at the second point in time t2, the second sampling and holding circuit 1141-2 may sample the signal S3*a* to generate the second sampling value SV2; at the third point in time t3, the third sampling and holding circuit 1141-3 may sample the signal S3*a* to generate the third sampling value SV3; and, at the fourth point in time t4, the fourth sampling and holding circuit 1141-4 may sample the signal S3*a* to generate the fourth sampling value SV4. An example in which the first sampling value SV1 is output after the fourth point in time t4 is illustrated in FIG. 6. This may be understood as the first sampling value SV1 is output after the sampling operation and the holding operation.

Figure 7:
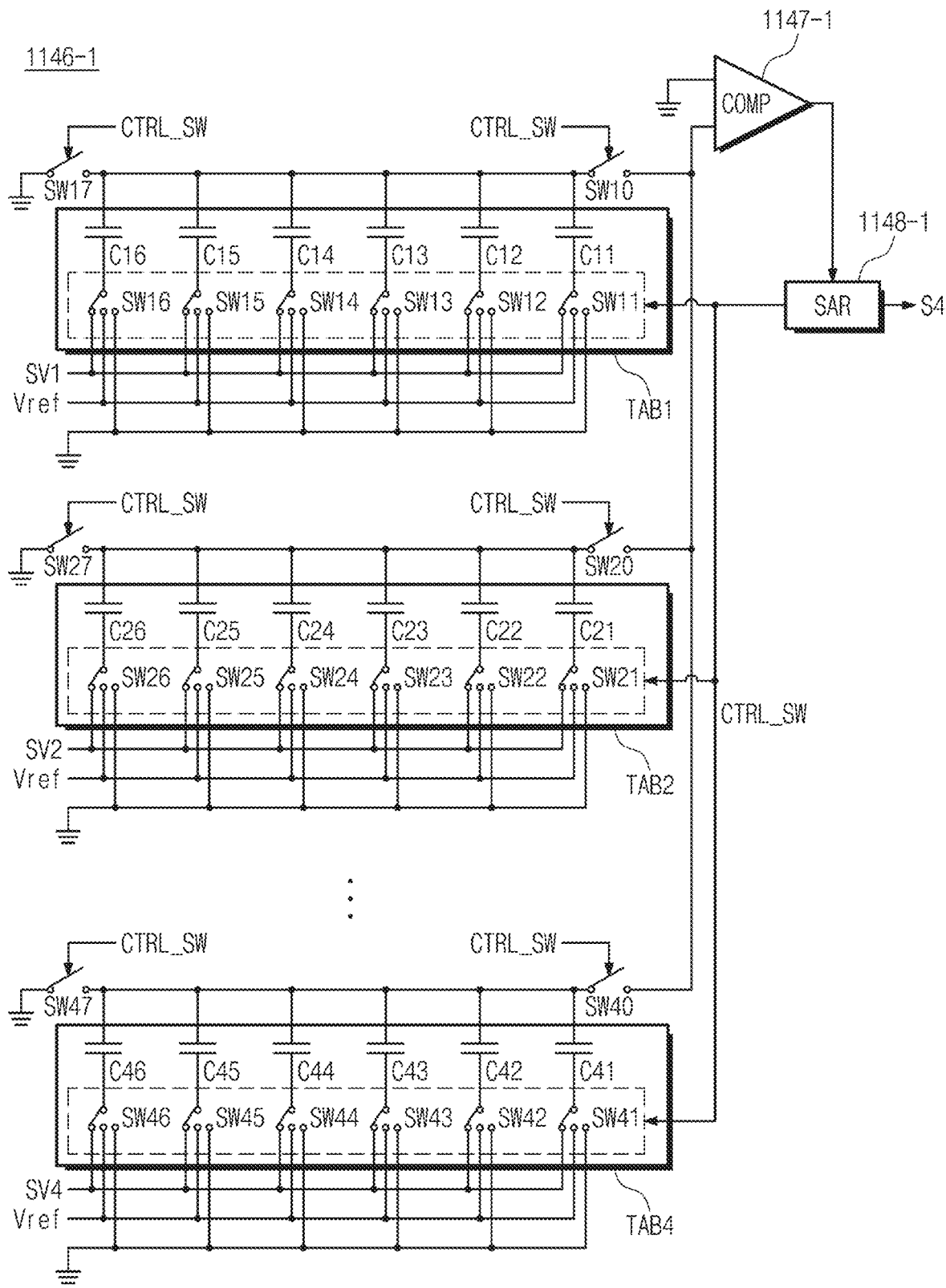
FIG. 7 is an example circuit diagram illustrating a configuration of a C-DAC of FIG. 5.

FIG. 7 is an example circuit diagram illustrating a configuration of a C-DAC of FIG. 5. A circuit diagram of the first C-DAC 1146-1 is illustrated as an example, and the remaining C-DACs 1146-2 to 1146-m also have the same structure as the first C-DAC 1146-1. For better understanding, the first comparator 1147-1 and the first SAR logic circuit 1148-1 are illustrated together.

The first C-DAC 1146-1 may include a plurality of taps, and each tap of the first C-DAC 1146-1 may include a plurality of capacitors and a plurality of switches. In some implementations, the first C-DAC 1146-1 may include taps TAB1 to TAB4, and the first tap TAB1 may include capacitors C11 to C16 and switches SW11 to SW16. As illustrated in drawing, a capacitor (e.g., C11) and a switch (e.g., SW11) corresponding to the capacitor may be connected in series, which is called a "switched capacitor". The expression "to control a switched capacitor" may mean that a switch (e.g., SW11) connected to a capacitor (e.g., C11) is controlled. In some implementations, the number of taps is not limited to the above example, and the number of switched capacitors included in each tap is not limited to the above example.

Meanwhile, the number of capacitors of each tap may be associated with the number of bits of output data of the ADC (i.e., the resolution of the ADC). In some implementations, the condition of "$C_{i+1} = 2 \times C_i$ and $C11 = C12$" (i being an integer between 12 and 15) may be established between capacitances of the capacitors C11 to C16, and the capacitors C11 to C16 of FIG. 7 may be implemented to sample 5-bit data. This may be regarded as the first tap TAB1 has a resolution corresponding to a 5-bit FFE coefficient. For example, when the capacitance of the capacitor C11 is 1 pF, the capacitances of the capacitors C12 to C16 may respectively be 1 pF, 2 pF, 4 pF, 8 pF, and 16 pF.

In addition, the number of taps connected to the first input terminal of the first comparator 1147-1 may be associated with the number of bits of a result (i.e., S4) of the successive approximation operation. For example, as illustrated in FIG. 7, when four taps are connected to the first input terminal of the first comparator 1147-1, a value of the digital signal S4 may be composed of 7 bits.

A switch SW10 may be connected between the first tap TAB1 and the first comparator 1147-1, and a switch SW17 may be connected between the first tap TAB1 and a ground terminal. The switch SW10 may participate in charge sharing with the remaining taps TAB2 to TAB4, and the switch SW17 may participate in sampling.

The switches SW11 to SW16 and the switches SW10 and SW17 may be individually control by a switch control signal CTRL_SW generated by the first SAR logic circuit 1148-1. Each of the capacitors C11 to C16 may be selectively connected to one of a first input voltage SV1, a reference voltage Vref, and a ground voltage through the corresponding switch among the switches SW11 to SW16. The first tap TAB1 may be connected to the ground terminal through the switch SW17 or may be connected to the first input terminal of the first comparator 1147-1 through the switch SW10.

The first comparator 1147-1 may compare a voltage corresponding to the amount of charges accumulated at the taps TAB1 to TAB4 and may sequentially output digital values. The first input terminal of the first comparator 1147-1 may be selectively connected to the taps TAB1 to TAB4 through switches SW10, SW20, SW30, and SW40, and the second input terminal of the first comparator 1147-1 may be connected to the reference voltage. For example, the reference voltage may be the ground voltage, but the present disclosure is not limited thereto. For example, the reference voltage may be a positive voltage or a negative voltage.

The first SAR logic circuit 1148-1 may perform the successive approximation operation based on the digital values received from the first comparator 1147-1 and may output the multi-bit digital signal S4. The first SAR logic circuit 1148-1 may generate the switch control signal CTRL_SW based on the digital value (i.e., S4) generated in the previous successive approximation operation. As the switches SW11 to SW16 of the first tap TAB1 are controlled by the switch control signal CTRL_SW, some of the capacitors C11 to C16 may participate in sampling the first input voltage SV1.

Operations of the remaining taps TAB2 to TAB4 may be similar to the above operation associated with the first tap TAB1. However, according to the present disclosure, to implement the FFE in the SAR-ADC 1132 (refer to FIG. 4), switch control timings of the taps TAB1 to TAB4 may be different. For example, after sampling the first input voltage SV1 by using the first tap TAB1, a second input voltage SV2 may be sampled by using the second tap TAB2. As in the above description, after sampling is performed with respect to the second input voltage SV2, sampling may be sequentially performed with respect to the input voltages SV3 and SV4.

Figure 8:
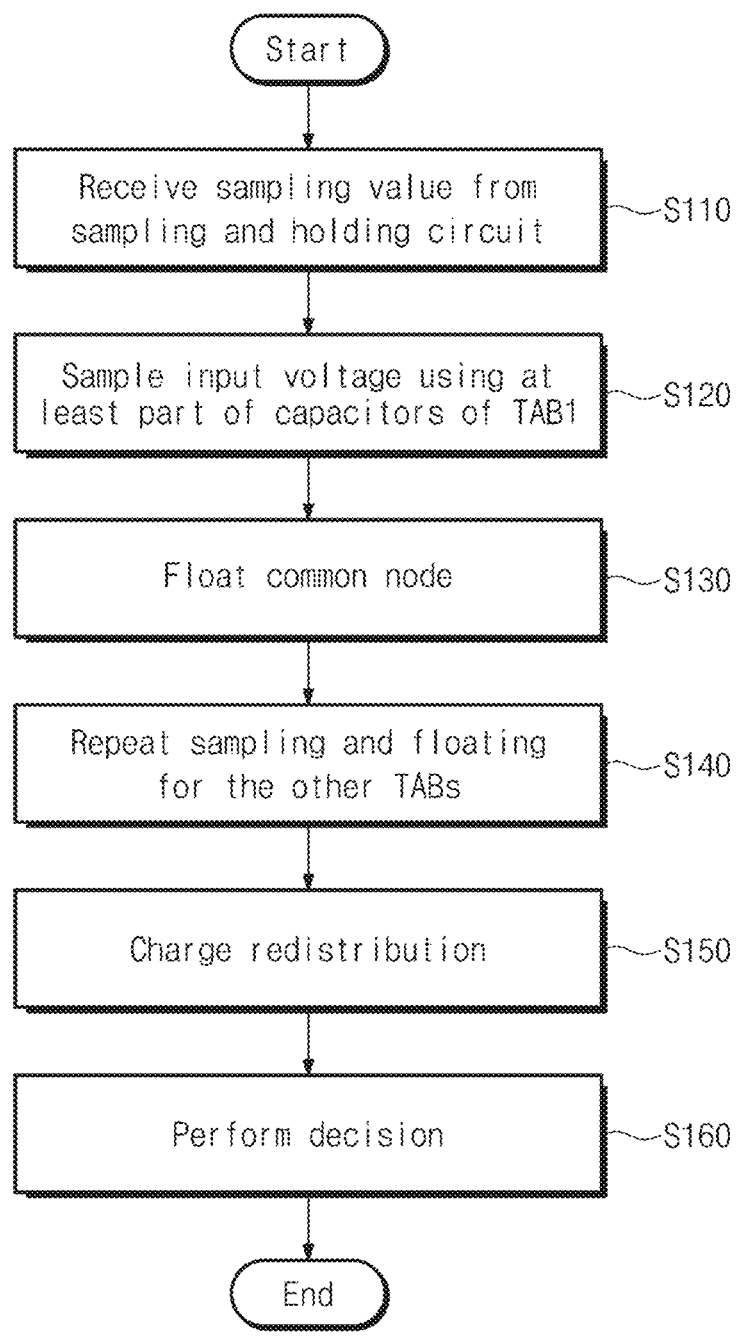
FIG. 8 is an example flowchart illustrating an operation of an SAR-ADC of FIG. 7.

FIG. 8 is an example flowchart illustrating an operation of an SAR-ADC of FIG. 7. FIGS. 9, 11, 12, and 13 are example circuit diagrams illustrating operations of respective states of a C-DAC of FIG. 7. FIG. 10 is an example diagram illustrating how an SAR logic circuit generates a switch control signal. Below, an operation of an SAC-ADC performing feed forward equalization will be described with reference to FIGS. 8 to 13.

Figure 9:
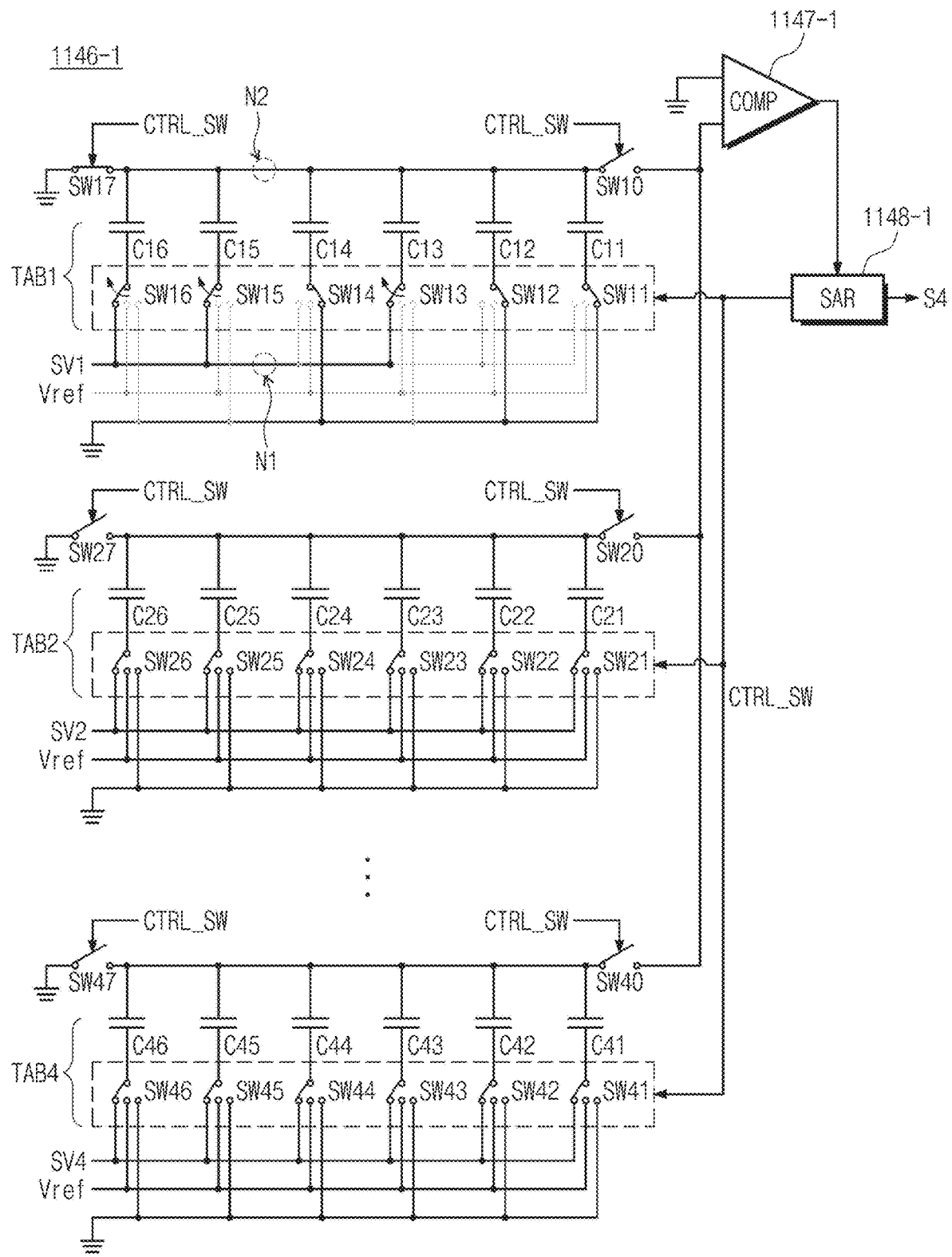
FIG. 9 is an example circuit diagram illustrating an operation for each state of a C-DAC of FIG. 7.
Figure 10:
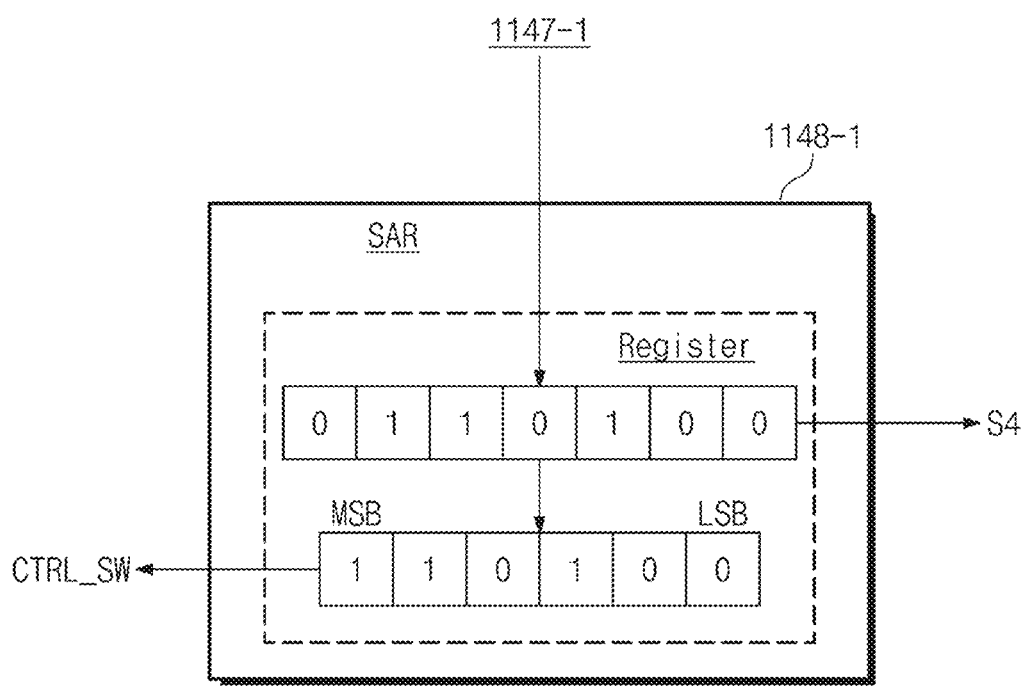
FIG. 10 is an example diagram illustrating how an SAR logic circuit generates a switch control signal.

Referring to FIGS. 8 and 9, the first tap TAB1 receives, as an input voltage, a sampling value from one of sampling and holding circuits (e.g., 1145-1 to 1145-m of FIG. 5) (S110). In some implementations, first, the first tap TAB1 receives a first input voltage (i.e., the first sampling value SV1) from the first sampling and holding circuit 1141-1.

Next, the first input voltage SV1 is sampled by using at least some of the capacitors of the first tap TAB1. The first SAR logic circuit 1148-1 controls the switches SW1l to SW16 such that at least some of the capacitors C11 to C16 participate in sampling. For example, the first SAR logic circuit 1148-1 generates the switch control signal CTRL_SW for individually controlling the switches SW11 to SW16.

In some implementations, referring to FIGS. 9 and 10, to select capacitors participating in sampling, the first SAR logic circuit 1148-1 may utilize a digital value (i.e., S4) generated in the previous successive approximation operation. For example, when each tap has a resolution corresponding to a 5-bit FFE coefficient and when the first C-DAC 1146-1 includes four taps as illustrated in FIG. 9, the digital value S4 output from the first SAR logic circuit 1148-1 may be composed of 7 bits. Herein, the first SAR logic circuit 1148-1 may generate the switch control signal CTRL_SW for individually controlling the switches SW11 to SW16 based on the 7-bit digital value S4.

In some implementations, the first SAR logic circuit 1148-1 may select at least some of the 7 bits of the digital value S4 to generate the 6-bit switch control signal CTRL_SW. For example, the most significant bit MSB of the switch control signal CTRL_SW may be used as a signal for controlling the switch SW16, and the least significant bit LSB of the switch control signal CTRL_SW may be used as a signal for controlling the switch SW1. For example, bit value "1" may correspond to a value for switching on the switch SW16, and bit value "0" may correspond to a value for switching off the switch SW11, but, it is not limited thereto.

In some implementations, the first SAR logic circuit 1148-1 may combine the seven bits of the digital value S4 to generate the 6-bit switch control signal CTRL_SW. In this case, various combinations may be used to generate the 6-bit switch control signal CTRL_SW.

Some of the switches SW11 to SW16 may be selectively controlled such that the first input voltage SV1 is input to first electrodes of capacitors corresponding to the selectively controlled switches from among the capacitors C11 to C16. In some implementations, an example in which the first input voltage SV1 is input to the first electrodes of the capacitors C13, C15, and C16 and the ground voltage is input to the first electrodes of the capacitors C11, C12, and C14 is illustrated in FIG. 9.

By using the switch control signal CTRL_SW, the first SAR logic circuit 1148-1 may switch off the switch SW10 and may switch on the switch SW17. As a result, the second electrodes of the capacitors C11 to C16 may be connected to the ground terminal and may be electrically disconnected from the first input terminal of the first comparator 1147-1.

In some implementations, when the voltage level of the first input voltage SV1 is Vin, the voltage level of a first node N1 may be Vin, and the voltage level of a second node N2 may be 0 V. Herein, the second node N2 that is a node connected in common to the second ends of the capacitors C11 to C16 and is connected to the first input terminal of the first comparator 1147-1 may be called a "common node". A voltage difference of opposite ends of each of the capacitors C13, C15, and C16 may be maintained at Vin until the switches SW10 to SW17 are separately controlled.

Figure 11:
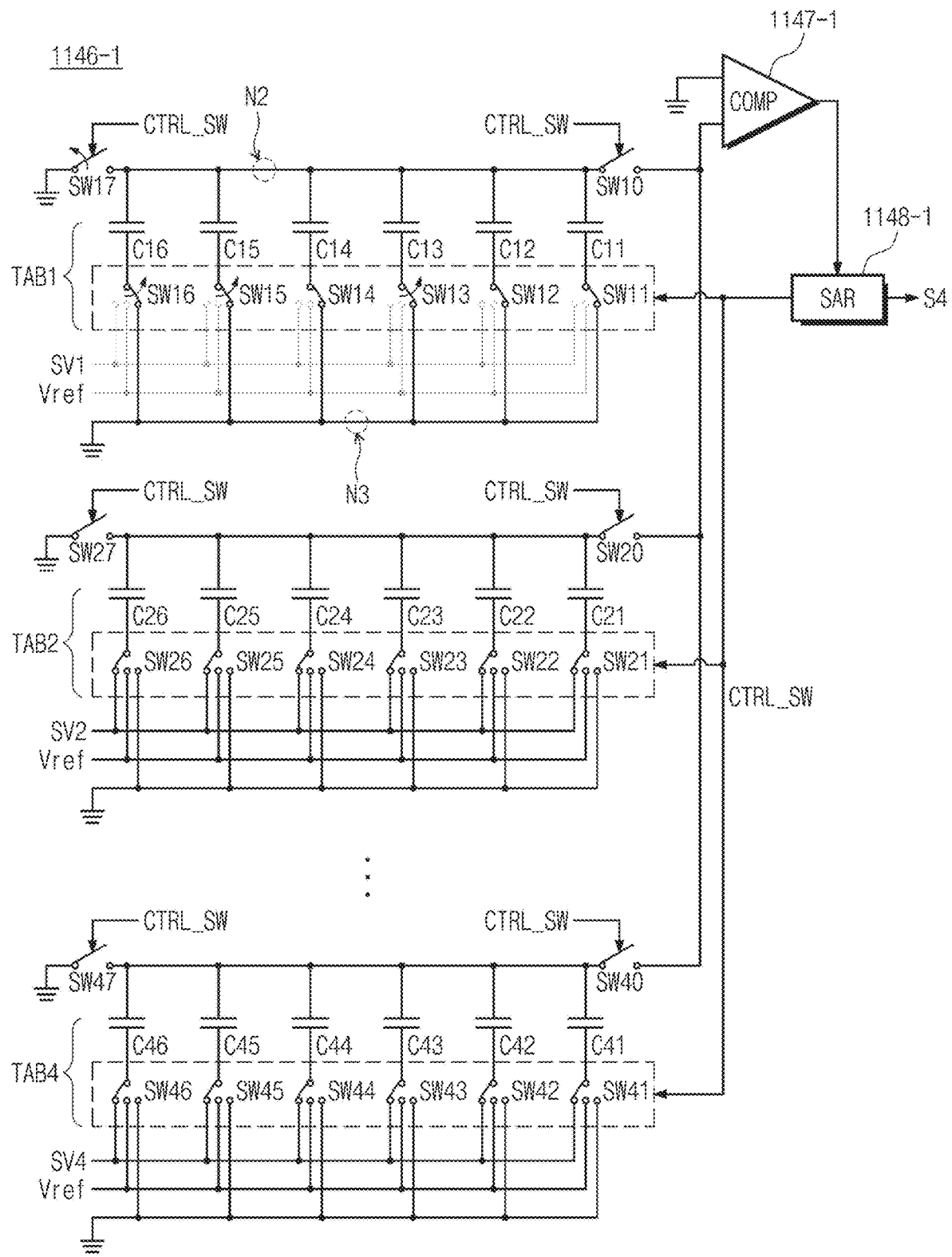
FIG. 11 is an example circuit diagram illustrating an operation for each state of a C-DAC of FIG. 7.

Referring to FIGS. 8 and 11, the common node N2 is floated (S130). To this end, the first SAR logic circuit 1148-1 controls the switches SW13, SW15, and SW16 based on the switch control signal CTRL_SW such that the first electrodes of the capacitors C13, C15, and C16 are connected to the ground terminal. At the same time, the first SAR logic circuit 1148-1 switches off the switch SW17 by using the switch control signal CTRL_SW.

According to the above switching operation, the voltage level of the first electrodes of the capacitors C13, C15, and C16 may decrease to 0 V in a state where the voltage difference of opposite ends of each of the capacitors C13, C15, and C16 is maintained at Vin. This may mean that the conservation law of electrical charge is applied as it is. Because a difference between the voltage level of a node N3 and the voltage level of the second node N2 should maintain Vin, the voltage level of the second node N2 may decrease from 0 V to −Vin. That is, information about the sampling performed by the capacitors C13, C15, and C16 may be stored at the common node N2 in the form of charges.

Meanwhile, for convenience of description, the above floating operation is described as being distinguished from the sampling described with reference to FIG. 9. However, in the wide meaning, the floating operation may be understood as a portion of the sampling operation that is performed by some of the capacitors of the first tap TAB1.

Returning to FIG. 8, in operation S140, the receiving of the sampling value (S110), the sampling (S120), and the floating (S130) are repeatedly performed by at least one of the remaining taps TAB2 to TAB4.

For example, the second tap TAB2 may receive the second input voltage SV2 from the second sampling and holding circuit 1141-2. As in the above description given with reference to FIG. 9, the second tap TAB2 may receive the second input voltage SV2, may perform the sampling operation with respect to the second input voltage SV2, and may perform the floating operation in a manner similar to that described with reference to FIG. 11. Herein, a difference between a point in time when the first tap TAB1 receives the first input voltage SV1 and a point in time when the second tap TAB2 receives the second input voltage SV2 may correspond to a sampling period of the sampling and holding circuits 1141-1 to 1141-m (refer to FIG. 5).

After the sampling and the floating of the second tap TAB2 are completed, the third tap TAB3 may perform the sampling and the floating based on an input voltage (i.e., the third input voltage SV3), and then, the fourth tap TAB4 may perform the sampling and the floating based on the fourth input voltage SV4.

According to operation S140 in which the sampling and the floating are repeated, the second tap TAB2 receives and samples the second input voltage SV2 that is delayed with respect to the first input voltage SV1 as much as the sampling period (i.e., T). Next, the third tap TAB3 receives and samples the third input voltage SV3 that is delayed with respect to the second input voltage SV2 as much as the sampling period (i.e., T), and the fourth tap TAB4 receives and samples the fourth input voltage SV4 that is delayed with respect to the third input voltage SV3 as much as the sampling period (i.e., T).

In some implementations, in operation S140 in which the sampling and the floating are repeated, a weight of the same value may be applied to the taps TAB1 to TAB4. In this case, the 6-bit value stored in the register of FIG. 10 may be used to generate the switch control signal CTRL_SW without modification, and the taps TAB1 to TAB4 may have the same FFE coefficient. However, in some implementations, in operation S140 in which the sampling and the floating are repeated, weights of different values may be applied to the taps TAB1 to TAB4. In this case, a value different from the 6-bit value stored in the register of FIG. 10 may be selected from the 7-bit digital value (i.e., S4), and at least some of the taps TAB1 to TAB4 may have the same FFE coefficient.

Figure 12:
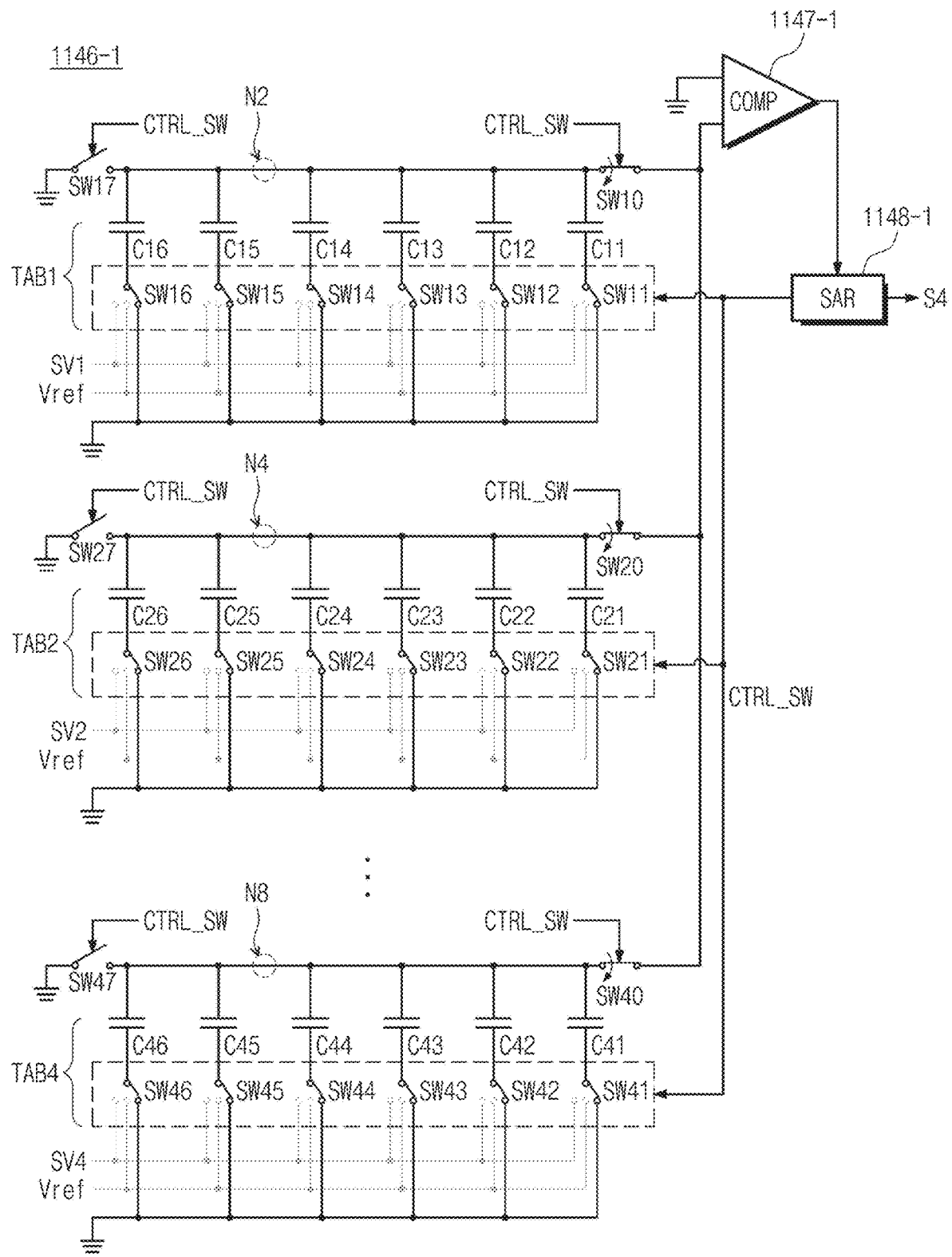
FIG. 12 is an example circuit diagram illustrating an operation for each state of a C-DAC of FIG. 7.

Referring to FIGS. 8 and 12, charge redistribution may be performed between the taps TAB1 to TAB4. The switches SW10, SW20, SW30, and SW40 connecting the taps TAB1 to TAB4 with the first comparator 1147-1 may be switched on by the switch control signal CTRL_SW. As such, the charge redistribution may be made at the nodes N2, N4, N6, and N8, and the nodes N2, N4, N6, and N8 may have the same potential. Herein, the total amount of charges accumulated at the nodes N2, N4, N6, and N8 where the charge redistribution is made may be regarded as a sum of values each obtained by multiplying an input voltage (i.e., one of SV1, SV2, SV3, and SV4) and a relevant weight together. Because the input voltages (i.e., SV1, SV2, SV3, and SV4) respectively correspond to data signals received at different timings, the total amount of shared charges may indicate a result of performing the feed forward equalization.

Although the switch SW30 and the node N6 are not illustrated in drawing, the switch SW30 may be understood as a switch of the third tap TAB3, which corresponds to the switch SW10 of the first tap TAB1. Also, the node N6 may be understood as a node of the third tap TAB3, which corresponds to the node N2 of the first tap TAB1.

Figure 13:
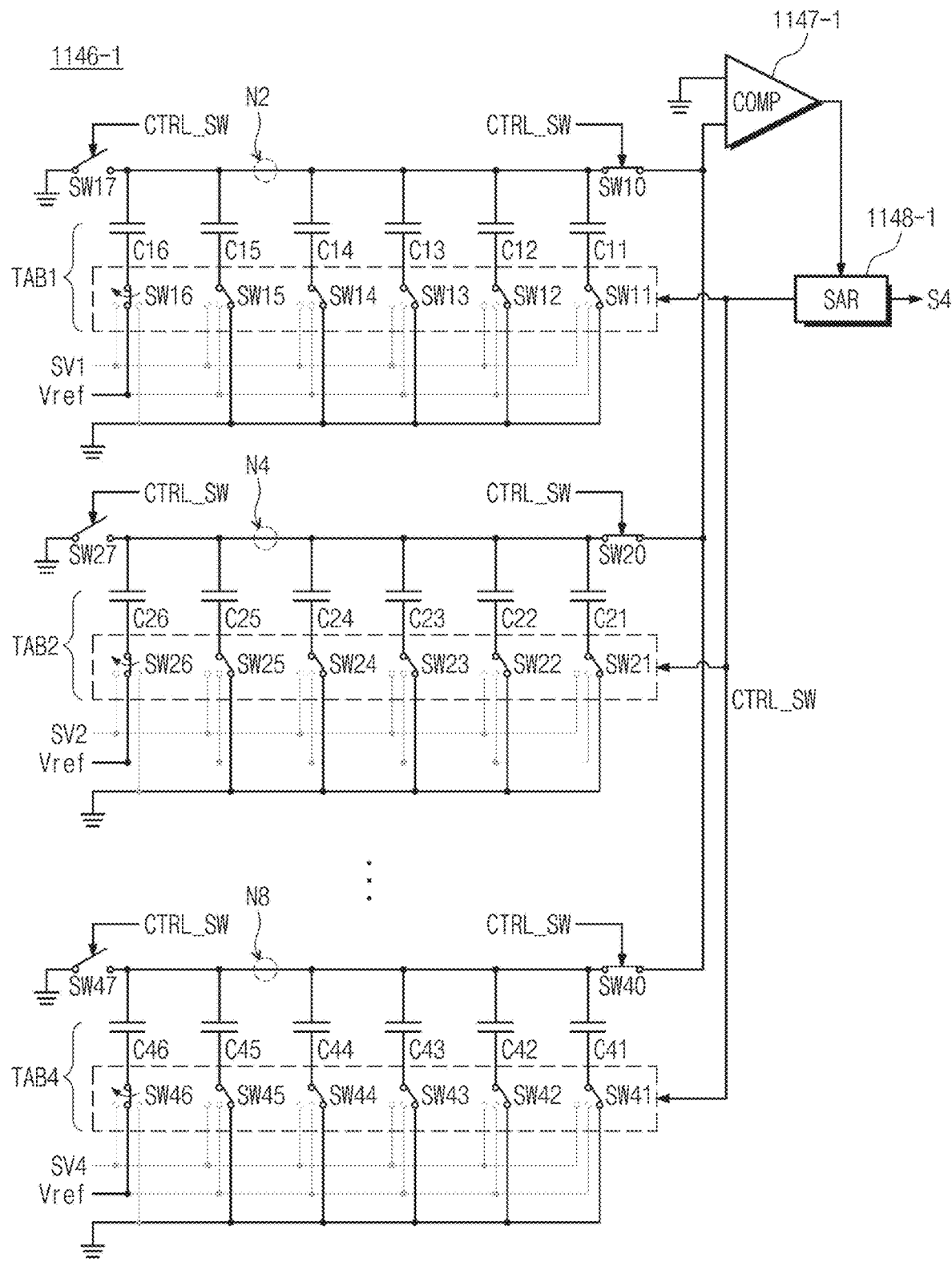
FIG. 13 is an example circuit diagram illustrating an operation for each state of a C-DAC of FIG. 7.

Referring to FIGS. 8 and 13, decision is performed by the first comparator 1147-1 (S160). For example, while the successive approximation operation is performed, the first SAR logic circuit 1148-1 allows the switches SW11 to SW16 to be sequentially open or closed, by using the switch control signal CTRL_SW generated by a finite state machine FSM.

In detail, the switching of the switches SW16, SW26, SW36, and SW46 may be performed to determine the most significant bit MSB of data corresponding to charges accumulated at the first C-DAC 1146-1. The capacitors C16, C26, C36, and C46 may be connected to a terminal, to which the reference voltage Vref is applied, depending on the switching of the switches SW16, SW26, SW36, and SW46. As a result, the potential of the second node N2 (or N4, N6, or N8) may change from −Vin to a voltage expressed by Equation below.

$$-Vin + \frac{\text{capacitance of } C16}{\sum_{i=11}^{16} \text{capacitance of } Ci} \times Vref$$

The first comparator 1147-1 may compare the voltage (i.e., the voltage expressed by the above equation) and the ground voltage to determine the MSB. For example, when the comparison result is greater than "0", the MSB may be determined to be "1"; when the comparison result is smaller than "0", the MSB may be determined to be "0".

The same operation as described above may be performed with respect to the remaining switches for the purpose of determining center significant bits CSB and the least significant bit LSB. For example, in a state where capacitors of each tap are connected to the ground terminal, the switches SW11, SW21, SW31, and SW41 may be controlled to be connected to the terminal to which the reference voltage Vref is applied, and the first comparator 1147-1 may compare a changed voltage of the second node N2 and the ground voltage to determine the LSB.

The first comparator 1147-1 may sequentially output the comparison results to the first SAR logic circuit 1148-1, and the first SAR logic circuit 1148-1 may output the multi-bit digital signal S4 based on the comparison results of the first comparator 1147-1.

Figure 14:
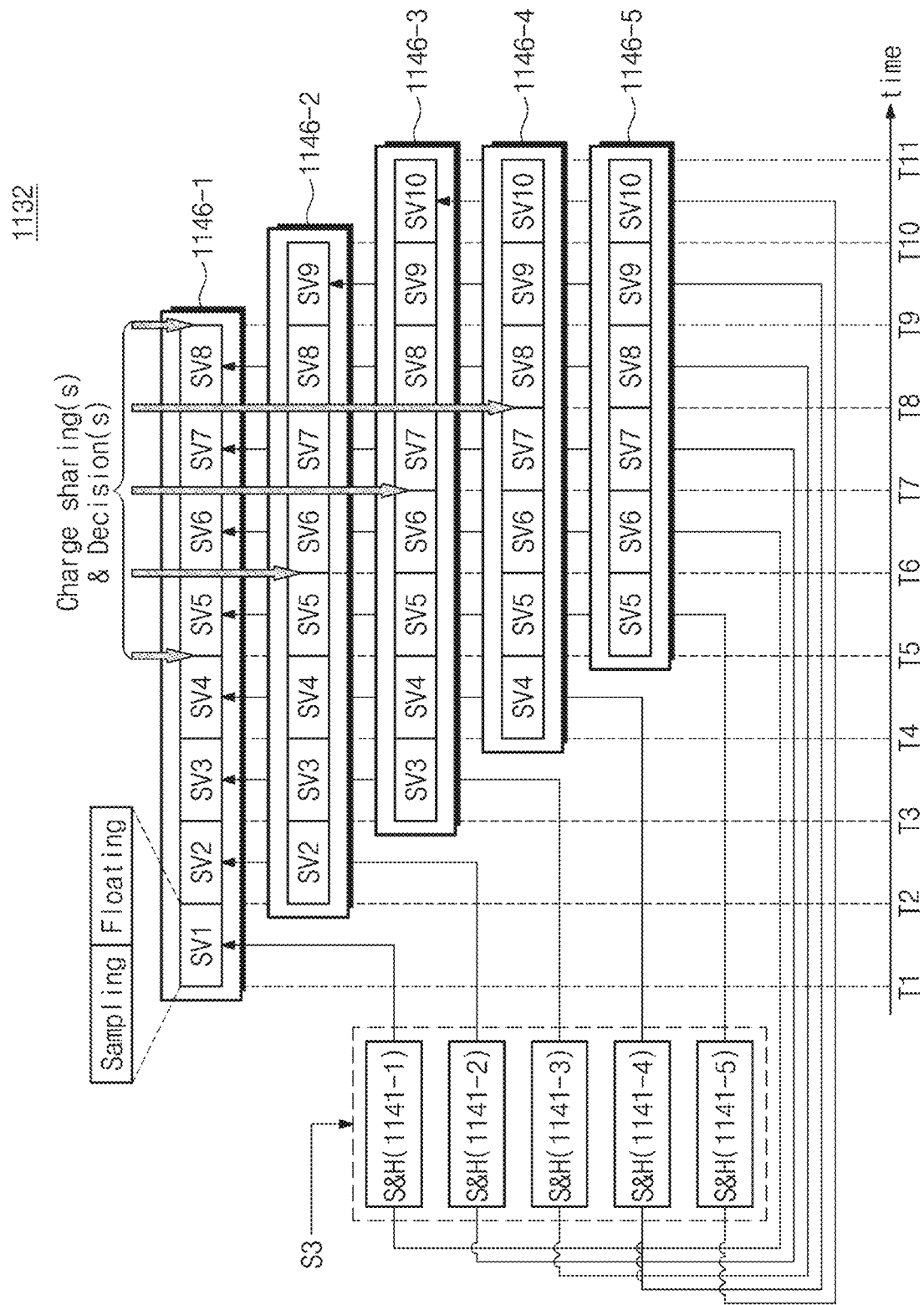
FIG. 14 is an example diagram illustrating feed forward equalization (FFE) performed by an SAR-ADC.

FIG. 14 is an example diagram illustrating feed forward equalization (FFE) performed by an SAR-ADC.

The SAR-ADC 1132 of FIG. 14 corresponds to the SAR-ADC 1132 described with reference to FIGS. 4 and 5. However, for brevity of illustration, the SAR-ADC 1132 that includes five sampling and holding circuits 1141-1 to 1141-5 and five C-DACs 1146-1 to 1146-5 is illustrated in FIG. 14.

At an arbitrary point in time (e.g., the point in time t1 of FIG. 6) before a point in time T1, the sampling and holding circuits 1141-1 to 1141-5 may perform sampling and holding with respect to the signal S3a. As a result, each of the sampling and holding circuits 1141-1 to 1141-5 may obtain a desired value by sampling the signal S3a at a given timing. For example, the first sampling and holding circuit 1141-1 may obtain the first sampling value SV1. As in the above description, the sampling and holding circuits 1141-2 to 1141-5 may respectively obtain the sampling values SV2, SV3, SV4, and SV5 by performing sampling at the points in time t2 to t5 (refer to FIG. 6).

At the point in time T1, the first tap TAB1 of the first C-DAC 1146-1 may receive the first sampling value SV1 as an input voltage and may perform sampling and floating based on the first input voltage SV1. The sampling and the holding may be performed in the same manner as described with reference to FIGS. 9 to 11. In the sampling and the floating, the FFE coefficient of the first tap TAB1 may be applied to the sampled charges by controlling switches such that at least some of capacitors of the first tap TAB1 participate in sampling. As the sampling result, charges, the amount of which corresponds to the first input voltage SV1, may be obtained.

At a point in time T2, the first C-DAC 1146-1 may receive the second sampling value SV2 as an input voltage and may perform sampling and floating based on the second input voltage SV2. Also, the second C-DAC 1146-2 may receive the second input voltage SV2 as an input voltage and may perform sampling and floating based on the second input voltage SV2. As the sampling result, charges, the amount of which corresponds to the second input voltage SV2, may be stored at each of the second tap TAB2 of the first C-DAC 1146-1 and the first tap TAB1 of the second C-DAC 1146-2.

At a point in time T3, each of the first to third C-DAC ADCs 1146-1 to 1146-3 may receive the third sampling value SV3 as an input voltage and may perform sampling and floating based on the third input voltage SV3. As the sampling result, charges, the amount of which corresponds to the third input voltage SV3, may be stored at each of the third tap TAB3 of the first C-DAC 1146-1, the second tap TAB2 of the second C-DAC 1146-2, and the first tap TAB1 of the third C-DAC 1146-3.

At a point in time T4, the first C-DAC 1146-1 to the fourth C-DAC 1146-4 may receive the fourth sampling value SV4 as an input voltage and may perform sampling and floating based on the fourth input voltage SV4. As the sampling result, charges, the amount of which corresponds to the fourth input voltage SV4, may be stored at each of the fourth tap TAB4 of the first C-DAC 1146-1, the third tap TAB3 of the second C-DAC 1146-2, the second tap TAB2 of the third C-DAC 1146-3, and the first tap TAB1 of the fourth C-DAC 1146-4.

After the charges corresponding to the signals sampled and held at different points in time are stored at four taps of the first C-DAC 1146-1, at a point in time T5, the first C-DAC 1146-1 may perform charge sharing and decision. The charge sharing and the decision may be performed in the same manner as described with reference to FIGS. 12 and 13. The first C-DAC 1146-1 may output the determined bits as a digital value.

Afterwards, the first C-DAC 1146-1 to the fourth C-DAC 1146-4 may sequentially perform the sampling, the charge sharing, the decision, etc. and may sequentially output determined digital values.

Figure 15:
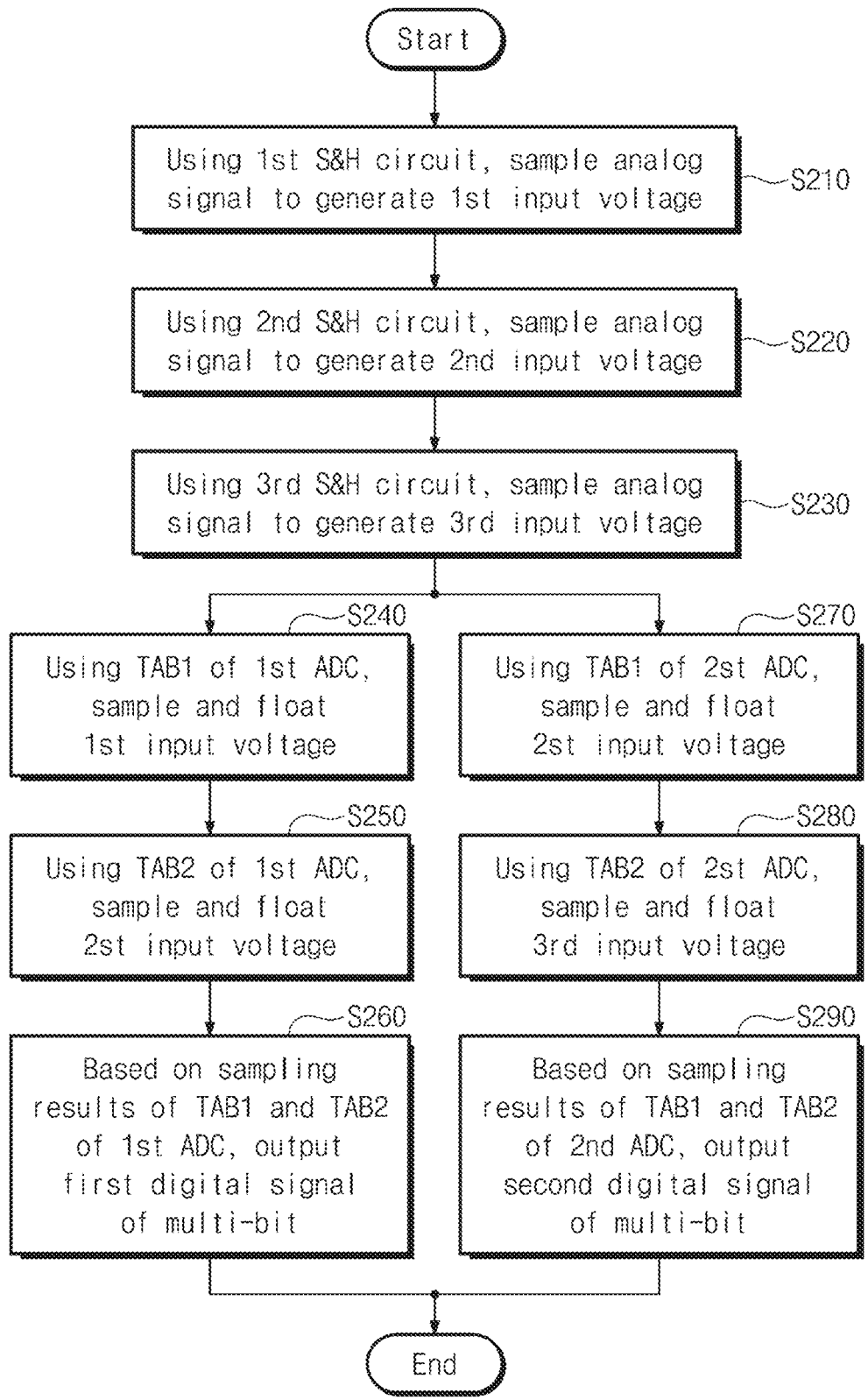
FIG. 15 is a flowchart illustrating an example of an operation of an SAR-ADC.

FIG. 15 is a flowchart illustrating an example of an operation of an SAR-ADC.

Unlike the implementation of FIG. 8, in an implementation of FIG. 15, FFE functions of a plurality of ADCs are performed in parallel. To implement the SAR-ADC with the FFE function of the present disclosure, because at least two sampling and holding circuits and an ADC including at least two taps are required, the operation of the SAR-ADC will be described with reference to a structure implemented by simplifying the configuration of FIG. 5.

Referring to FIGS. 5 and 15, in operation S210, the first input voltage SV1 may be generated by sampling the analog signal S3a by using the first sampling and holding circuit 1141-1.

In operation S220, the second input voltage SV2 may be generated by sampling the analog signal S3a by using the second sampling and holding circuit 1141-2. A point in time when the second input voltage SV2 is sampled may be different from a point in time when the first input voltage SV1 is sampled.

In operation S230, the third input voltage SV3 may be generated by sampling the analog signal S3a by using the third sampling and holding circuit 1141-3. A point in time when the third input voltage SV3 is sampled may be different from the point in time when the first input voltage SV1 is sampled and the point in time when the second input voltage SV2 is sampled.

In operation S240, the first input voltage SV1 may be sampled by using the first tap TAB1 of the first ADC 1145-1. The first tap TAB1 may have an FFE coefficient corresponding to capacitors participating in sampling. Afterwards, in operation S250, the second input voltage SV2 may be sampled by using the second tap TAB2 of the first ADC 1145-1. In the first ADC 1145-1, each of the first tap TAB1 and the second tap TAB2 may have the FFE coefficient corresponding to capacitors participating in sampling.

In operation S260, the first ADC 1145-1 may output a first multi-bit digital signal based on the sampling result of the first tap TAB1 and the sampling result of the second tap TAB2. For example, in the first ADC 1145-1, the charge redistribution may be made by allowing the output signal of the first tap TAB1 and the output signal of the second tap TAB2 to be short-circuited. Herein, the total amount of charges stored at the first C-DAC 1146-1 of the first ADC 1145-1 corresponds to a sum of the input voltage SV1 of the first tap TAB1 by which a weight is multiplied and the input voltage SV2 of the second tap TAB2 by which a weight is multiplied. This may correspond to a result value obtained after FFE filtering.

Meanwhile, operation S240 to operation S260 that are performed by the first ADC 1145-1 may be performed in parallel in the second ADC 1145-2. For example, the second input voltage SV2 may be sampled by using the first tap TAB1 of the second ADC 1145-2 (S270), and the third input voltage SV3 may be sampled by using the second tap TAB2 of the second ADC 1145-2 (S280).

Afterwards, in operation S290, the second ADC 1145-2 may output a second multi-bit digital signal based on the sampling result of the first tap TAB1 and the sampling result of the second tap TAB2. For example, in the second ADC 1145-2, the charge redistribution may be made by allowing the output signal of the first tap TAB1 and the output signal of the second tap TAB2 to be short-circuited. Herein, the total amount of charges stored at the second C-DAC 1146-2 of the second ADC 1145-2 corresponds to a sum of the input voltage SV2 of the first tap TAB1 by which a weight is multiplied and the input voltage SV3 of the second tap TAB2 by which a weight is multiplied. This may correspond to a result value obtained after FFE filtering.

In some implementations, the first multi-bit digital signal may be a digital signal corresponding to the first input voltage SV1, which is determined in consideration of the interference with the second input voltage SV2. Also, the second multi-bit digital signal may be a digital signal corresponding to the second input voltage SV2, which is determined in consideration of the interference with the third input voltage SV3. That is, the first multi-bit digital signal and the second multi-bit digital signal may be signals where the inter-symbol interference is removed (i.e., which experience feed forward equalization).

Figure 16:
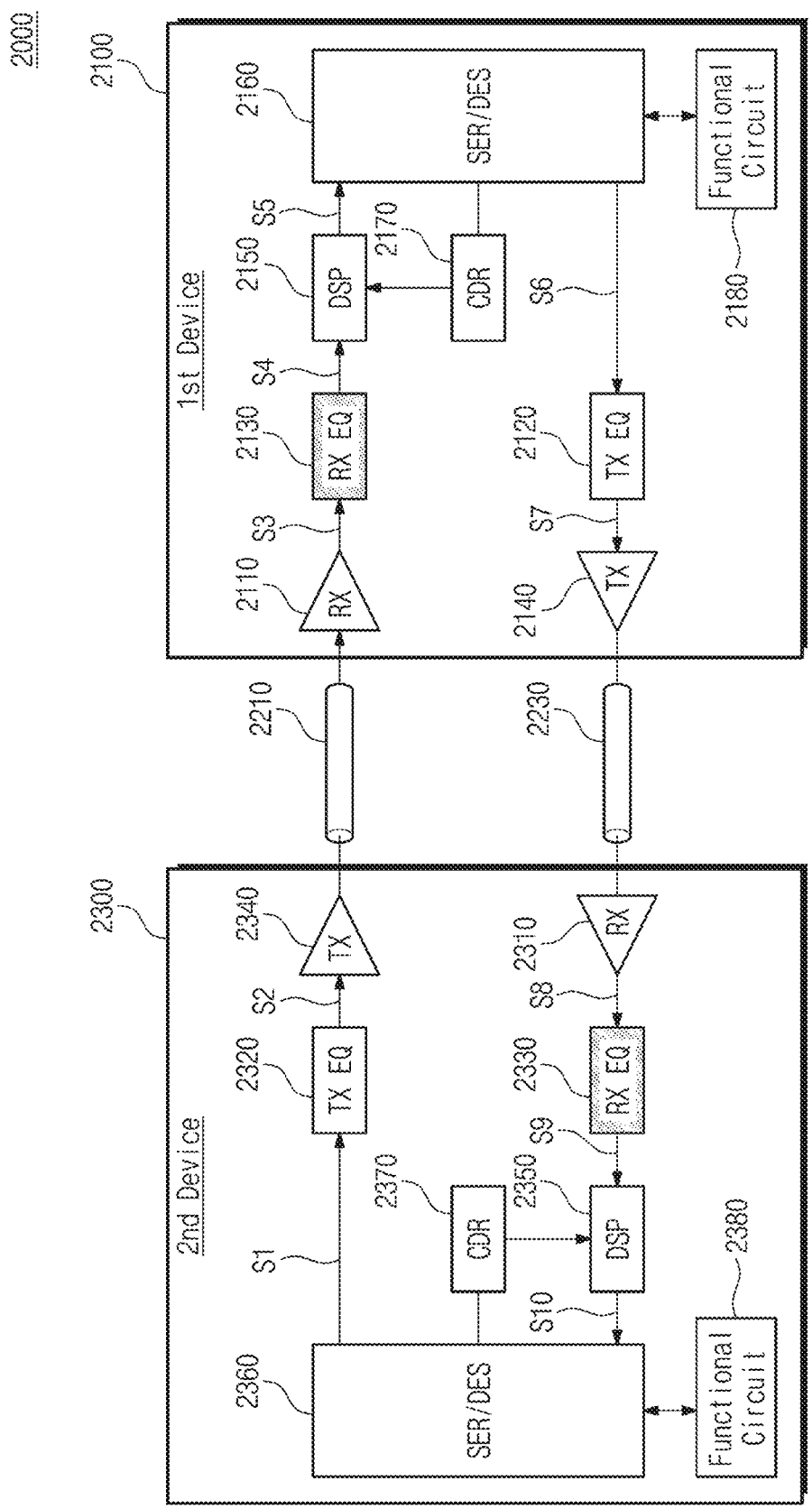
FIG. 16 illustrates a configuration of an example of an electronic system including equalizers.

FIG. 16 is a block diagram illustrating a configuration of an example of an electronic system 2000 including equalizers.

The electronic system 2000 includes a first device 2100 and a second device 2300. In some implementations, each of the devices 2100 and 2300 is implemented with one of various electronic devices such as a smartphone, a wearable device, a desktop computer, a laptop computer, and a tablet computer.

The first device 2100 and the second device 2300 exchange signals through channels 2210 and 2230. For example, the first device 2100 receives a signal from the second device 2300 through the first communication channel 2210 and transmits a signal to the second device 2300 through the second communication channel 2230.

The first device 2100 includes a receiver 2110, a transmission equalizer 2120, a reception equalizer 2130, a transmitter 2140, a DSP 2150, a serializer/deserializer (SER/DES) 2160, a CDR circuit 2170, and functional circuits 2180. The second device 2300 includes a receiver 2310, a transmission equalizer 2320, a reception equalizer 2330, a transmitter 2340, a DSP 2350, an SER/DES 2360, a CDR circuit 2370, and functional circuits 2380.

The receivers 2110 and 2310, the reception equalizers 2130 and 2330, the DSPs 2150 and 2350, the CDR circuits 2170 and 2370, and the functional circuits 2180 and 2380 may correspond to the components described with reference to FIGS. 1 to 14.

The SER/DES 2360 may serialize data generated depending on operations of the functional circuits 2380. The SER/DES 2360 may provide the signal S1 corresponding to the serialized data to the transmission equalizer 2320. The transmission equalizer 2320 may generate the signal S2 by performing pre-equalization with respect to the signal S1. The transmitter 2340 may transmit the signal S2 to the first device 2100 through the first communication channel 2210.

The reception equalizer 2130 may include an SAR-ADC performing the FFE function described with reference to FIGS. 1 to 14. The SAR-ADC of the reception equalizer 2130 may output the multi-bit digital signal S4, and the DSP 2150 may perform additional equalization with respect to the signal S4 by using the DFE. The DSP 2150 may output a signal S5 as a result of the equalization.

The SER/DES 2160 may deserialize data received from the DSP 2150. The SER/DES 2160 may provide the deserialized data to the functional circuits 2180. The functional circuits 2180 may operate based on the provided data.

As in the above description, the SER/DES 2160 may serialize data generated depending on operations of the functional circuits 2180 and may provide a signal S6 to the transmission equalizer 2120. The transmission equalizer 2120 may generate a signal S7 by performing pre-equalization with respect to the signal S6. The transmitter 2140 may transmit the signal S7 to the second device 2300 through the second communication channel 2230.

The receiver 2310 may provide a signal S8 to the reception equalizer 2330 based on the signal received through the second communication channel 2230. The reception equalizer 2330 including an SAR-ADC performing the FFE function of the present disclosure may generate a signal S9 by performing equalization with respect to the signal S8. The CDR circuit 2370 may recover a clock and data from the signal S9. The DSP 2350 may provide the clock and the data recovered by the CDR circuit 2370 to the SER/DES 2360.

The SER/DES 2360 may deserialize the provided data. The SER/DES 2360 may provide the deserialized data to the functional circuits 2380. The functional circuits 2380 may operate based on the provided data.

Figure 17:
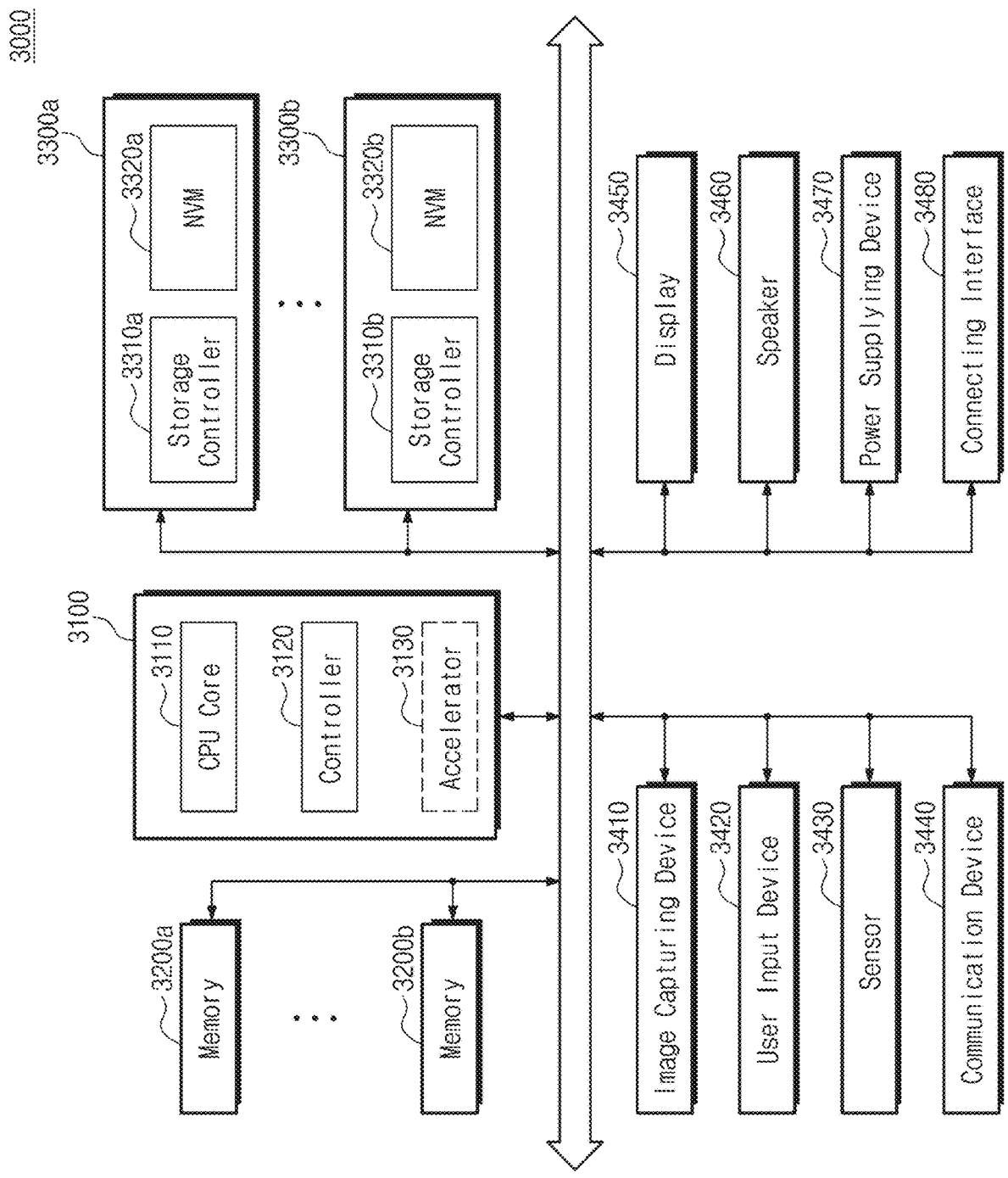
FIG. 17 illustrates a configuration of an example of a system including an equalizer.

FIG. 17 is a diagram of an example of a system 3000 which includes an equalizer.

The system 3000 includes a main processor 3100, memories (e.g., 3200a and 3200b), and storage devices (e.g., 3300a and 3300b). In addition, the system 3000 includes at least one of an image capturing device 3410, a user input device 3420, a sensor 3430, a communication device 3440, a display 3450, a speaker 3460, a power supplying device 3470, and a connecting interface 3480.

The main processor 3100 may control all operations of the system 3000, more specifically, operations of other components included in the system 3000. The main processor 3100 may be implemented as a general-purpose processor, a dedicated processor, or an application processor.

The main processor 3100 may include at least one CPU core 3110 and further include a controller 3120 configured to control the memories 3200a and 3200b and/or the storage devices 3300a and 3300b. In some implementations, the main processor 3100 may further include an accelerator 3130, which is a dedicated circuit for a high-speed data operation, such as an artificial intelligence (AI) data operation. The accelerator 3130 may include a graphics processing unit (GPU), a neural processing unit (NPU) and/or a data processing unit (DPU) and be implemented as a chip that is physically separate from the other components of the main processor 3100.

The memories 3200a and 3200b may be used as main memory devices of the system 3000. Although each of the memories 3200a and 3200b may include a volatile memory, such as static random access memory (SRAM) and/or dynamic RAM (DRAM), each of the memories 3200a and 3200b may include non-volatile memory, such as a flash memory, phase-change RAM (PRAM) and/or resistive RAM (RRAM). The memories 3200a and 3200b may be implemented in the same package as the main processor 3100.

The storage devices 3300a and 3300b may serve as non-volatile storage devices configured to store data regardless of whether power is supplied thereto, and have larger storage capacity than the memories 3200a and 3200b. The storage devices 3300a and 3300b may respectively include storage controllers (STRG CTRL) 3310a and 3310b and NVM (Non-Volatile Memory)s 3320a and 3320b configured to store data via the control of the storage controllers 3310a and 3310b. Although the NVMs 3320a and 3320b may include flash memories having a two-dimensional (2D) structure or a three-dimensional (3D) V-NAND structure, the NVMs 3320a and 3320b may include other types of NVMs, such as PRAM and/or RRAM.

The storage devices 3300a and 3300b may be physically separated from the main processor 3100 and included in the system 3000 or implemented in the same package as the main processor 3100. In addition, the storage devices 3300a and 3300b may have types of solid-state devices (SSDs) or memory cards and be removably combined with other components of the system 3000 through an interface, such as the connecting interface 3480 that will be described below. The storage devices 3300a and 3300b may be devices to which a standard protocol, such as a universal flash storage (UFS), an embedded multi-media card (eMMC), or a non-volatile memory express (NVMe), is applied, without being limited thereto.

The image capturing device 3410 may capture still images or moving images. The image capturing device 3410 may include a camera, a camcorder, and/or a webcam.

The user input device 3420 may receive various types of data input by a user of the system 3000 and include a touch pad, a keypad, a keyboard, a mouse, and/or a microphone.

The sensor 3430 may detect various types of physical quantities, which may be obtained from the outside of the system 3000, and convert the detected physical quantities into electric signals. The sensor 3430 may include a temperature sensor, a pressure sensor, an illuminance sensor, a position sensor, an acceleration sensor, a biosensor, and/or a gyroscope sensor.

The communication device 3440 may transmit and receive signals between other devices outside the system 3000 according to various communication protocols. The communication device 3440 may include an antenna, a transceiver, and/or a modem.

The display 3450 and the speaker 3460 may serve as output devices configured to respectively output visual information and auditory information to the user of the system 3000.

The power supplying device 3470 may appropriately convert power supplied from a battery embedded in the system 3000 and/or an external power source, and supply the converted power to each of components of the system 3000.

The connecting interface 3480 may provide connection between the system 3000 and an external device, which is connected to the system 3000 and capable of transmitting and receiving data to and from the system 3000. The connecting interface 3480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In particular, the connecting interface 3480 may include a physical layer for connection with an external device, and the physical layer may include an SAR-ADC performing the FFE function of the present disclosure.

According to the present disclosure, a successive approximation register analog-to-digital converter performing a function of a feed forward equalizer without a separate feed forward equalizer may be provided.

Accordingly, because a separate feed forward equalizer provided at a digital stage in general is not required, a chip size and power consumption may be reduced.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While the present disclosure has been described with reference to implementations thereof, it will be apparent to those of ordinary skill in the art that various changes and modifications may be made thereto without departing from the spirit and scope of the present disclosure as set forth in the following claims.

What is claimed is:

1. A successive approximation register analog-to-digital converter that is configured to perform a successive approximation operation, comprising:
a first sampling and holding circuit configured to sample an analog signal at a first point in time and to generate a first input voltage;
a second sampling and holding circuit configured to sample the analog signal at a second point in time and to generate a second input voltage; and
a first analog-to-digital converter including a first plurality of capacitors that are configured to sample the first input voltage and a second plurality of capacitors that are configured to sample the second input voltage,
wherein the first analog-to-digital converter is configured to use at least some capacitors among the first plurality of capacitors to sample the first input voltage and to use at least some capacitors among the second plurality of capacitors to sample the second input voltage, and
wherein the first analog-to-digital converter is configured to output a first multi-bit digital signal based on a sum of first charges and second charges, the first charges corresponding to a result of sampling the first input voltage and the second charges corresponding to a result of sampling the second input voltage.

2. The successive approximation register analog-to-digital converter of claim 1, comprising:
a third sampling and holding circuit configured to sample the analog signal and to generate a third input voltage; and
a second analog-to-digital converter including a third plurality of capacitors that are configured to sample the third input voltage,
wherein the second analog-to-digital converter is configured to use at least some capacitors among the third plurality of capacitors to sample the third input voltage, and
wherein the second analog-to-digital converter is configured to output a second multi-bit digital signal based on a sum of the second charges and third charges, the third charges corresponding to a result of sampling the third input voltage.

3. The successive approximation register analog-to-digital converter of claim 1, wherein the first analog-to-digital converter includes:
a first capacitive digital-to-analog converter including the first plurality of capacitors and the second plurality of capacitors;
a comparator configured to compare an output of the first capacitive digital-to-analog converter and a first reference voltage, and to sequentially output a plurality of comparison results; and
a first successive approximation register logic circuit configured to output the first multi-bit digital signal based on the plurality of comparison results.

4. The successive approximation register analog-to-digital converter of claim 1, wherein a first plurality of electrodes of the first plurality of capacitors are connected to a first node, and a first plurality of electrodes of the second plurality of capacitors are connected to a second node, and
wherein the first analog-to-digital converter includes:
a first plurality of switches respectively connected to a second plurality of electrodes of the first plurality of capacitors;
a second plurality of switches respectively connected to a second plurality of electrodes of the second plurality of capacitors;
a first comparator configured to compare voltages of the first node and the second node with a first reference voltage, and to sequentially output a plurality of comparison results; and
a first successive approximation register logic circuit configured to output the first multi-bit digital signal based on the plurality of comparison results.

5. The successive approximation register analog-to-digital converter of claim 4, wherein the first successive approximation register logic circuit is configured to generate a switch control signal that controls the first plurality of switches and the second plurality of switches based on a multi-bit digital signal generated in a successive approximation operation previously performed.

6. The successive approximation register analog-to-digital converter of claim 4, wherein the first analog-to-digital converter includes:
a third plurality of switches configured to connect the first node with a first input terminal of the first comparator or a ground terminal; and
a fourth plurality of switches configured to connect the second node with the first input terminal of the first comparator or the ground terminal,
wherein the first successive approximation register logic circuit is configured to generate a switch control signal that controls the first plurality of switches, the second plurality of switches, the third plurality of switches, and the fourth plurality of switches,
wherein, under control of the switch control signal, the first node is connected to the ground terminal and is disconnected from the first input terminal of the first comparator, and
wherein, under control of the switch control signal, at least some capacitors of the first plurality of capacitors are connected to a terminal to which the first input voltage is input.

7. The successive approximation register analog-to-digital converter of claim 6, wherein, under control of the switch control signal, the first node is connected to the ground terminal and is disconnected from the first input terminal of the first comparator, and
wherein, under control of the switch control signal, the at least some capacitors of the first plurality of capacitors are connected to the ground terminal.

8. The successive approximation register analog-to-digital converter of claim 7, wherein, under control of the switch control signal, the second node is connected to the ground terminal and is disconnected from the first input terminal of the first comparator, and
wherein, under control of the switch control signal, at least some capacitors of the second plurality of capacitors are connected to a terminal to which the second input voltage is input.

9. The successive approximation register analog-to-digital converter of claim 8, wherein, under control of the switch control signal, the second node is connected to the ground terminal and is disconnected from the first input terminal of the first comparator, and
wherein, under control of the switch control signal, the at least some capacitors of the second plurality of capacitors are connected to the ground terminal.

10. The successive approximation register analog-to-digital converter of claim 9, wherein, under control of the switch control signal, the first node and the second node are disconnected from the ground terminal and are connected to the first input terminal of the first comparator.

11. The successive approximation register analog-to-digital converter of claim 10, wherein, under control of the switch control signal, a first capacitor selected from the first plurality of capacitors and a second capacitor selected from the second plurality of capacitors and corresponding to the first capacitor are connected to a terminal to which a second reference voltage is input, and wherein the first comparator is configured to output a digital value based on a voltage change of the first node and the second node.

12. The successive approximation register analog-to-digital converter of claim 11, wherein the first analog-to-digital converter is configured to output the first multi-bit digital signal based on a successive approximation operation.

13. A successive approximation register analog-to-digital converter comprising:

a first sampling and holding circuit configured to sample an analog signal to generate a first input voltage;

a second sampling and holding circuit configured to sample the analog signal to generate a second input voltage after the first input voltage is sampled;

a first analog-to-digital converter including a first tap and a second tap, each tap of the first tap and the second tap including a plurality of switched capacitors; and a second analog-to-digital converter including a third tap and a fourth tap, each tap of the third tap and the fourth tap including a plurality of switched capacitors, wherein the first tap is configured to sample the first input voltage at a first point in time, wherein the second tap is configured to sample the second input voltage at a second point in time, wherein the third tap is configured to sample the second input voltage at the second point in time, and wherein the first analog-to-digital converter is configured to output a first multi-bit digital signal based on a sum of first charges and second charges, the first charges corresponding to a sampling result of the first tap and the second charges corresponding to a sampling result of the second tap.

14. The successive approximation register analog-to-digital converter of claim 13, comprising:

a third sampling and holding circuit configured to sample the analog signal to generate a third input voltage, wherein the fourth tap is configured to sample the third input voltage at a third point in time.

15. The successive approximation register analog-to-digital converter of claim 14, wherein the second analog-to-digital converter is configured to output a second multi-bit digital signal based on a sum of third charges and fourth charges, the third charges corresponding to a sampling result of the third tap and the fourth charges corresponding to a sampling result of the fourth tap.

16. The successive approximation register analog-to-digital converter of claim 13, wherein at least some switched capacitors of the plurality of switched capacitors of the first tap are configured to perform the sampling of the first input voltage at the first point in time, and wherein at least some switched capacitors of the plurality of switched capacitors of the second tap are configured to perform the sampling of the second input voltage at the second point in time.

17. The successive approximation register analog-to-digital converter of claim 16, wherein the first analog-to-digital converter is configured to generate a switch control signal that controls the plurality of switched capacitors of the first tap and the plurality of switched capacitors of the second tap based on a multi-bit digital signal generated in a successive approximation operation previously performed.

18. An operating method of a successive approximation register analog-to-digital converter, the method comprising:

sampling an analog signal at a first point in time to generate a first input voltage by using a first sampling and holding circuit;

sampling the analog signal at a second point in time to generate a second input voltage by using a second sampling and holding circuit;

sampling the first input voltage by using a first tap of a first analog-to-digital converter;

sampling the second input voltage by using a second tap of the first analog-to-digital converter;

sampling the second input voltage by using a third tap of a second analog-to-digital converter; and outputting a first multi-bit digital signal based on a sampling result of the first tap and a sampling result of the second tap.

19. The method of claim 18, comprising:

sampling the analog signal at a third point in time to generate a third input voltage by using a third sampling and holding circuit;

sampling the third input voltage by using a fourth tap of the second analog-to-digital converter; and outputting a second multi-bit digital signal based on a sampling result of the third tap and a sampling result of the fourth tap.

20. The method of claim 19, wherein each tap of the first tap, the second tap, the third tap, and the fourth tap includes a plurality of switched capacitors, and wherein the plurality of switched capacitors are controlled based on a first multi-bit digital signal or a second multi-bit digital signal generated in a successive approximation operation previously performed.

* * * * *